United States Patent
Owa et al.

(10) Patent No.: US 12,026,437 B2
(45) Date of Patent: Jul. 2, 2024

(54) QUOTATION SYSTEM, QUOTATION METHOD, AND QUOTATION PROGRAM

(71) Applicant: MISUMI CORPORATION, Tokyo (JP)

(72) Inventors: Kenta Owa, Tokyo (JP); Tomoaki Yokota, Tokyo (JP)

(73) Assignee: MISUMI CORPORATION, Tokyo (JP)

( * ) Notice: Subject to any disclaimer, the term of this patent is extended or adjusted under 35 U.S.C. 154(b) by 0 days.

(21) Appl. No.: 18/184,924

(22) Filed: Mar. 16, 2023

(65) Prior Publication Data

US 2023/0222257 A1 Jul. 13, 2023

Related U.S. Application Data

(63) Continuation of application No. 17/761,006, filed as application No. PCT/JP2021/005006 on Feb. 10, 2021, now Pat. No. 11,640,488.

(30) Foreign Application Priority Data

May 26, 2020 (JP) ................................ 2020-091638

(51) Int. Cl.
*G06F 30/17* (2020.01)
*G06F 30/12* (2020.01)
*G06Q 10/087* (2023.01)

(52) U.S. Cl.
CPC ............. *G06F 30/17* (2020.01); *G06F 30/12* (2020.01); *G06Q 10/087* (2013.01)

(58) Field of Classification Search
CPC .......... G06F 30/17; G06F 30/00; G06F 30/12; G06F 30/10; G06F 2111/16;
(Continued)

(56) References Cited

U.S. PATENT DOCUMENTS

| | | | |
|---|---|---|---|
| 2011/0191057 A1 | 8/2011 | Sheehan | |
| 2019/0121925 A1* | 4/2019 | Hurt | ........................ G06F 30/17 |
| 2019/0146465 A1 | 5/2019 | Tsutsumi et al. | |

FOREIGN PATENT DOCUMENTS

| | | |
|---|---|---|
| CN | 102317900 A | 1/2012 |
| DE | 102018219183 A1 | 5/2019 |

(Continued)

OTHER PUBLICATIONS

Inui, Masatomo et al., "Algebraic Interpretation of Geometric Tolerances for Evaluating Geometric Uncertainties in Solid Modeling", 1993, 2nd ACM Solid Modeling, ACM. (Year: 1993).*

(Continued)

*Primary Examiner* — Cedric Johnson
(74) *Attorney, Agent, or Firm* — Leason Ellis LLP; Jordan G. Garner; Melvin C. Garner

(57) ABSTRACT

A quotation system receives shape data of an article configured from a plurality of elements from a client terminal and provides quotation information of the article. The quotation system has: a memory storing the shape data and tolerance data in which multiple types of tolerance information relating to the elements are associated with each other; and a computer performing assistance processing to assist in setting of at least one type of the multiple types of tolerance information on the basis of the tolerance data.

8 Claims, 11 Drawing Sheets

(58) Field of Classification Search
CPC ............. G06Q 10/087; G06Q 30/0611; G06Q 30/0621; G06Q 30/06; G06Q 50/04; G06Q 30/0283; Y02P 90/30
USPC ........................................................ 703/7, 6
See application file for complete search history.

(56) References Cited

FOREIGN PATENT DOCUMENTS

| EP | 2153935 A1 | * | 2/2010 | ............ B23Q 15/00 |
|----|------------|---|--------|-------------------------|
| EP | 2153935 A1 |   | 2/2010 |                         |
| JP | 2008158740 A |   | 7/2008 |                       |
| JP | 2008243192 A |   | 10/2008 |                      |
| JP | 2011165183 A |   | 8/2011 |                       |
| JP | 2012079094 A |   | 4/2012 |                       |
| JP | 2016062403 A | * | 4/2016 | ........... G06Q 10/067 |
| JP | 2016062403 A |   | 4/2016 |                       |
| JP | 2017208089 A | * | 11/2017 |                      |
| JP | 2017208089 A |   | 11/2017 |                      |

OTHER PUBLICATIONS

Syrjala, Tommi, "Tolerance Design and Coordinate Measurement in Product Development", Jan. 26, 2004, Thesis, Department of Mechanical Engineering, Helsinki University of Technology. (Year: 2004).*

Lasemi et al., "Recent Development in CNC Machining of Freeform Surfaces: A State-of-the-Art Review", 2010, Computer-Aided Design 42, Elsevier Ltd. (Year: 2010).*

Ayadi et al., "Three-Dimensional Modeling of Manufacturing Tolerancing using the Ascendant Approach", Oct. 23, 2007, Int J Adv Manuf Technol, Springer-Verlag. (Year: 2007).*

Ikeda et al., "Proposal for function feature and application of machining attribute information based thereon", Academic Lecture Proceedings of the 2007 Spring Conference of the Japan Society for Precision Engineering, Sep. 1, 2007 [Retrieved on Apr. 6, 2021] pp. 927-928 .< DOI: http://doi.org/10.11522/pscjspe.2007S.0.927.0>.

International Search Report dated Apr. 13, 2021 for the corresponding PCT International Patent Application No. PCT/JP2021/005006.

Inui, Masatomo et al., "Algebraic Interpretation of Geometric Tolerances for Evaluating Geometric Uncertainties in Solid Modeling", 1993, 2nd ACM Solid Modeling, ACM.

Syrjala, Tommi, "Tolerance Design and Coordinate Measurement in Product Development", Jan. 26, 2004, Thesis, Department of Mechanical Engineering, Helsinki University of Technology.

Lasemi et al., "Recent Development in CNC Machining of Freeform Surfaces: A State-of-the-Art Review", 2010, Computer-Aided Design 42, Elsevier Ltd.

Ayadi et al., "Three-Dimensional Modeling of Manufacturing Tolerancing using the Ascendant Approach", Oct. 23, 2007, Int J Adv Manuf Technol, Springer-Verlag.

Labisch, Susanna, Wählisch, Georg: Technisches Zeichnen-Eigenständig lernen und effektiv üben. 5th, revised edition. Berlin: Springer, 2017. pp. 72-99, pp. 119-120, pp. 127-130, pp. 134-166, and pp. 289-292.—ISBN: 978-3-658-18 313-4.

Standard DIN EN ISO 286-1 20 Sep. 19, 2000. Geometrical Product Specification (GPS) ISO tolerance system for linear dimensions—Part 1: Basics for tolerances, dimensions and fits.

Standard DIN EN ISO 286-2 20 Sep. 19, 2000. Geometrical Product Specification (GPS) ISO tolerance system for linear dimensions—Part 2: Tables of basic tolerance grades and limit deviations for bores and shafts.

Vajna, Sandor et al.: CAx für Ing enieure—Eine praxisbezogene Einfü hrung. 3rd, completely revised edition. Berlin: Springer, 2018. pp. 85-136, and 287-293.—ISBN: 978-3-6 62-54624-6.

U.S. Office Action dated Sep. 30, 2022 for the parent U.S. Appl. No. 17/761,006.

U.S. Notice of Allowance dated Feb. 3, 2023 for the parent U.S. Appl. No. 17/761,006.

* cited by examiner

FIG. 4

| < | BASIC INFORMATION | TREE VIEW |

ARTICLE A

- COMMON ITEM
  - EXTERNAL DIMENSION
    - X 100mm
    - Y 60mm
    - Z 20mm
- Top
  - HOLE
    - 4×M10
  - SLOT
    - Y 30mm
- Bottom
- Front
- Back
- Left
- Right

ARTICLE A  1 × 4,980 YEN = 4,980 YEN (6 DAYS)

(MODEL NUMBER) _____

CONFIRM QUOTATION

SHIP DATE ----Y--M--D
NUMBER OF ACTUAL WORK DAYS -DAYS

TOTAL YEN

| PRINT | OUTPUT ORDER LIST | PROCEED TO ORDER |

QUOTATION SYSTEM, QUOTATION METHOD, AND QUOTATION PROGRAM

CROSS-REFERENCE TO RELATED PATENT APPLICATIONS

This application is a Continuation of U.S. application Ser. No. 17/761,006 filed on Mar. 16, 2022, which is U.S. National Phase Application under 35 U.S.C. § 371 of International Patent Application No. PCT/JP2021/005006 filed on Feb. 10, 2021 and claims the benefit of priority to Japanese Patent Applications No. 2020-091638 filed on May 26, 2020, the contents of all of which are incorporated herein by reference in their entireties. The International Application was published in Japanese on Dec. 2, 2021 as International Publication No. WO2021/240907 under PCT Article 21(2).

FIELD OF THE INVENTION

The present invention relates to a quotation system, quotation method, and quotation program that assist in the setting of tolerance information.

BACKGROUND OF THE INVENTION

JP 2016-062403 A discloses an automatic quotation system. In this automatic quotation system, a shape recognition processing unit recognizes the shape of an item described in shape data input by a user. Then, a display information processing unit acquires manufacturing conditions that can be selected on the basis of the type of item input by the user and the shape of the recognized item. Furthermore, a display processing unit displays the general shape of the recognized item on an item shape display part in a display screen and displays the manufacturing conditions on a manufacturing condition selection part. The user selects any manufacturing condition from among the manufacturing conditions displayed on the manufacturing condition selection part. Then, the user selects a quotation start part displayed by a display unit to cause the automatic quotation system to initiate quotation processing.

CITATION LIST

Patent Literature

[Patent Literature 1] JP 2016-062403 A

Technical Problem

In an article ordered by a user, there are machining locations that require high precision, that is, machining locations that require severe tolerances. For example, when accurately positioning the position of another article with respect to one article, a positioning pin is used. Then, high precision is required for machining a mounting hole for mounting the positioning pin. That is, severe tolerances are required when machining mounting holes.

Therefore, when designing an article that includes a mounting hole, it is necessary to set the tolerance of the position of the mounting hole (tolerance of a machining position) and the tolerance of the hole diameter of the mounting hole. In a conventional system, the user inputs these tolerances on the basis of their own experience. Then, because this input operation is extremely labor-intensive, the processing time required for design processing accompanying the quotation of an article is prolonged.

Furthermore, there may be a plurality of candidates for the tolerance value and the tolerance input target. On the other hand, the user determines a tolerance to be input from among the plurality of candidates on the basis of their own experience. Therefore, there is a possibility that an error may occur where the user accidentally inputs the wrong tolerance value or accidentally inputs the tolerance for the wrong target. Moreover, because the user performs input manually, there is also a possibility of an error occurring where the input of a tolerance is omitted for a target that should be input.

SUMMARY OF THE INVENTION

Solution to Problem

A quotation system, according to one aspect of the present invention, is the quotation system that receives shape data of an article configured from a plurality of elements from a client terminal and provides quotation information of the article, and the quotation system comprising: storage means storing the shape data and tolerance data in which multiple types of tolerance information relating to the elements are associated with each other, and assistance means performing assistance processing to assist in setting of at least one type of the multiple types of tolerance information on the basis of the tolerance data.

Furthermore, a quotation method, according to one aspect of the present invention, is the quotation method in a quotation system that receives shape data of an article configured from a plurality of elements from a client terminal, provides quotation information of the article, and is provided with a computer, the quotation method comprising: storing the shape data and tolerance data in which multiple types of tolerance information relating to the elements are associated with each other; and performing assistance processing for assisting in setting of at least one type of the multiple types of tolerance information on the basis of the tolerance data.

Furthermore, a quotation program, according to one aspect of the present invention, is the quotation program of a quotation system that receives shape data of an article configured from a plurality of elements from a client terminal and provides quotation information of the article, and is provided with storage means storing the shape data and tolerance data in which multiple types of tolerance information relating to the elements are associated with each other, and a computer, wherein the quotation program causes the computer to function as: assistance means performing assistance processing to assist in setting of at least one type of the multiple types of tolerance information on the basis of the tolerance data.

Thus, the present invention is able to assist in the setting of tolerance information with respect to elements constituting an article and shorten the processing time required for design processing accompanying the quotation of the article. Furthermore, according to the present invention, the occurrence of errors accompanying the setting of tolerance information may be suppressed.

BRIEF DESCRIPTION OF THE DRAWINGS

FIG. 4 is a diagram illustrating one example of a quotation screen.

DETAILED DESCRIPTION OF THE INVENTION

Exemplary embodiments for implementing the present invention will be described in detail below with reference to drawings. However, the dimensions, material, shape, and relative positions of constituent elements described in the embodiments below may be set freely, and may be changed according to the configuration of a device to which the present invention is applied or various conditions. Furthermore, unless otherwise stated, the scope of the present invention is not limited to the embodiments specifically described below.

First Embodiment

Figure 1:
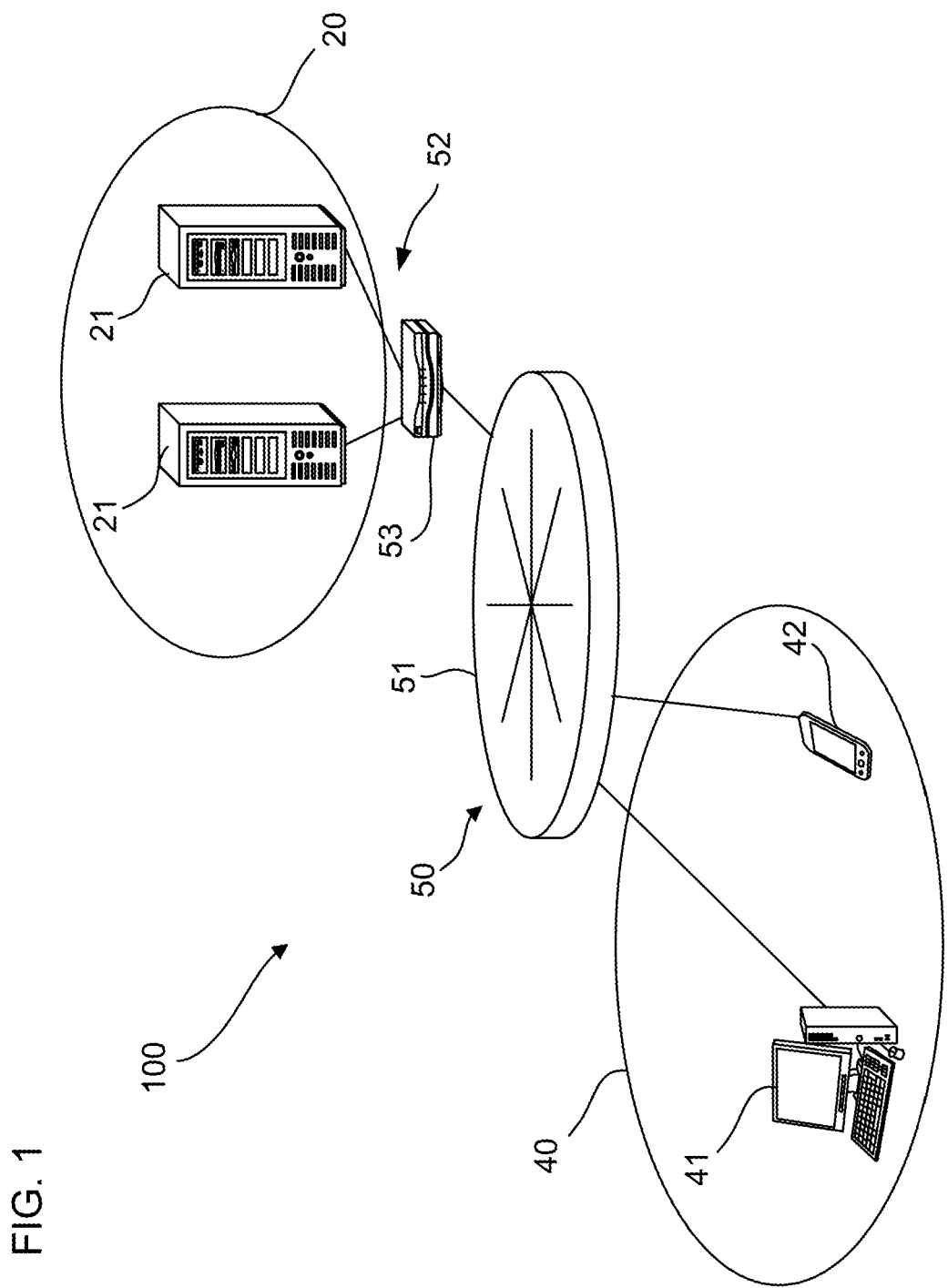
FIG. 1 is a schematic configuration diagram of an entire quotation system.

FIG. 1 illustrates a quotation system 100 used for quotation of the price of an article configured from a plurality of elements. The quotation system 100 receives shape data of an article from a client terminal 40 and provides quotation information of the article. For example, a server 20 of the quotation system 100 receives and stores shape data transmitted from the client terminal 40 by a user. As one example, an element is a portion constituting an article such as a hole, axis, step, notch, corner, plane, or ridge line and includes a shape obtained by machining. Furthermore, the shape data is 3D CAD data that includes the shape of the article and may include information such as the dimensions and position of each element. Note that the shape data may be data that includes the shape of the article, and may be 2D CAD data.

Attribute information such as tolerance required for each element is associated with the shape data. The attribute information includes first tolerance information relating to a tolerance with respect to a distance between the elements and second tolerance information relating to a tolerance with respect to a dimension within the elements. Furthermore, the attribute information may be included in the shape data, and the shape data and the attribute information may be different data. When the shape data and the attribute information are different data, for example, a table including attribute information associated with an element of the article is used.

The first tolerance information includes a tolerance of a distance from an origin to an element with reference to the origin set in the shape data. Furthermore, the first tolerance information includes a tolerance of a distance between a certain element subject to assistance and another element. Furthermore, the first tolerance information includes a tolerance of distance of an element to a geometric reference, for example, a tolerance of a machining position. Moreover, the first tolerance information includes, as another example, a tolerance of a distance from the geometric reference to the central axis of an element, for example, coaxiality or concentricity. Furthermore, the first tolerance information includes information identifying a subject constituting a geometric reference.

The second tolerance information is, as one example, a tolerance with respect to the size of an element, for example, a hole diameter, an axis diameter, width, length, depth, or outer diameter. Specifically, the second tolerance information includes a tolerance zone class relating to an element.

In addition, the attribute information includes information that indicates a customer order number, quantity, material, surface processing, content of comments (additional instructions), type of hole (hole type), hole diameter tolerance, effective depth (full thread length), slot width tolerance, external dimension tolerance, design origin, holes of the same group (group hole division), appearance plane (plane constituting the appearance of the article), font size (such as the dimensional notation), geometric tolerance, datum (reference for geometric tolerance), surface roughness, and the like, and that are various kinds of information used in quotation and subsequent manufacturing. Then, the attribute information includes information associated with an element of the article and information associated with the shape data.

Information such as the dimensions and position of each element and attribute information may be set in the CAD software of the client terminal 40. Furthermore, the quotation system 100 may be configured so that information such as the dimensions and position of each element and the attribute information may be set on a screen provided by the server 20.

The article (item) may be a finished product in which the article itself has one collective function, or may be one article incorporated into the finished product, or may be an assembly composed of a plurality of components. Moreover, the article includes a unit combining a plurality of components, a jig, a device, and equipment. Furthermore, holes of the same group are, for example, a plurality of holes that exist on the same plane and have the same diameter and depth. However, holes from among the same group of holes may be divided into different groups for each type of hole, and in the present specification, information indicating that they belong to divided groups is referred to as "group hole division". Furthermore, types of holes include, as one example, drill holes (hereinafter also called straight), tap holes, holes that require high precision when fitting together (hereinafter also referred to as precision holes), and the like.

The quotation system 100 is configured as a network system provided with the server 20 as a quotation server or as a client server system. The server 20 functions as a server device and is constituted as one logical server device by combining, for example, server units 21 as a plurality of computers. However, the server 20 may be constituted by a single server unit 21. Alternatively, the server 20 may be logically configured using cloud computing. The server 20 provides various kinds of services including an article quotation service to the client terminal 40 or to the user of the client terminal 40. These services include a distribution service for distributing a program or data to the client terminal 40 through a network 50 and a storage service for storing the data received from the client terminal 40. The distribution service is, for example, a service for distributing data for updating.

The client terminal 40 is a computer device capable of network connection. For example, the client terminal 40 includes a desktop or laptop type personal computer 41, a portable tablet terminal device 42, or like. In addition, a mobile terminal device such as a mobile phone (including a smart phone) is included as the client terminal 40. The client terminal 40 allows the user to enjoy various services provided by the server 20 by installing various kinds of computer software. Furthermore, the client terminal 40 may be connected to the server 20 through the predetermined network 50. Below, a case will be described where the client terminal 40 is the personal computer 41.

The network 50 is configured to be able to connect each client terminal 40 to the server 20. As one example, the network 50 is configured to realize network communication by using TCP/IP protocol. Specifically, a LAN (local area network) 52 connects the server 20 and an internet 51. Then, the internet 51 as a WAN (wide area network) and the LAN 52 are connected via a router 53. The client terminal 40 is also configured to be connected to the internet 51. The server units 21 of the server 20 may be mutually connected by the internet 51 in place of or in addition to the LAN 52.

The server 20 guides the user various kinds of procedures required for the user to quote the price of the article via the client terminal 40. That is, the server 20 functions as a web server that causes the display unit (display device 46, described below) of the client terminal 40 to display various kinds of web pages according to access from the client terminal 40. Furthermore, the server 20 may execute processing such as the arrangement of ordered articles, delivery instructions, and billing of the purchase price corresponding to an order by the user.

Figure 2:
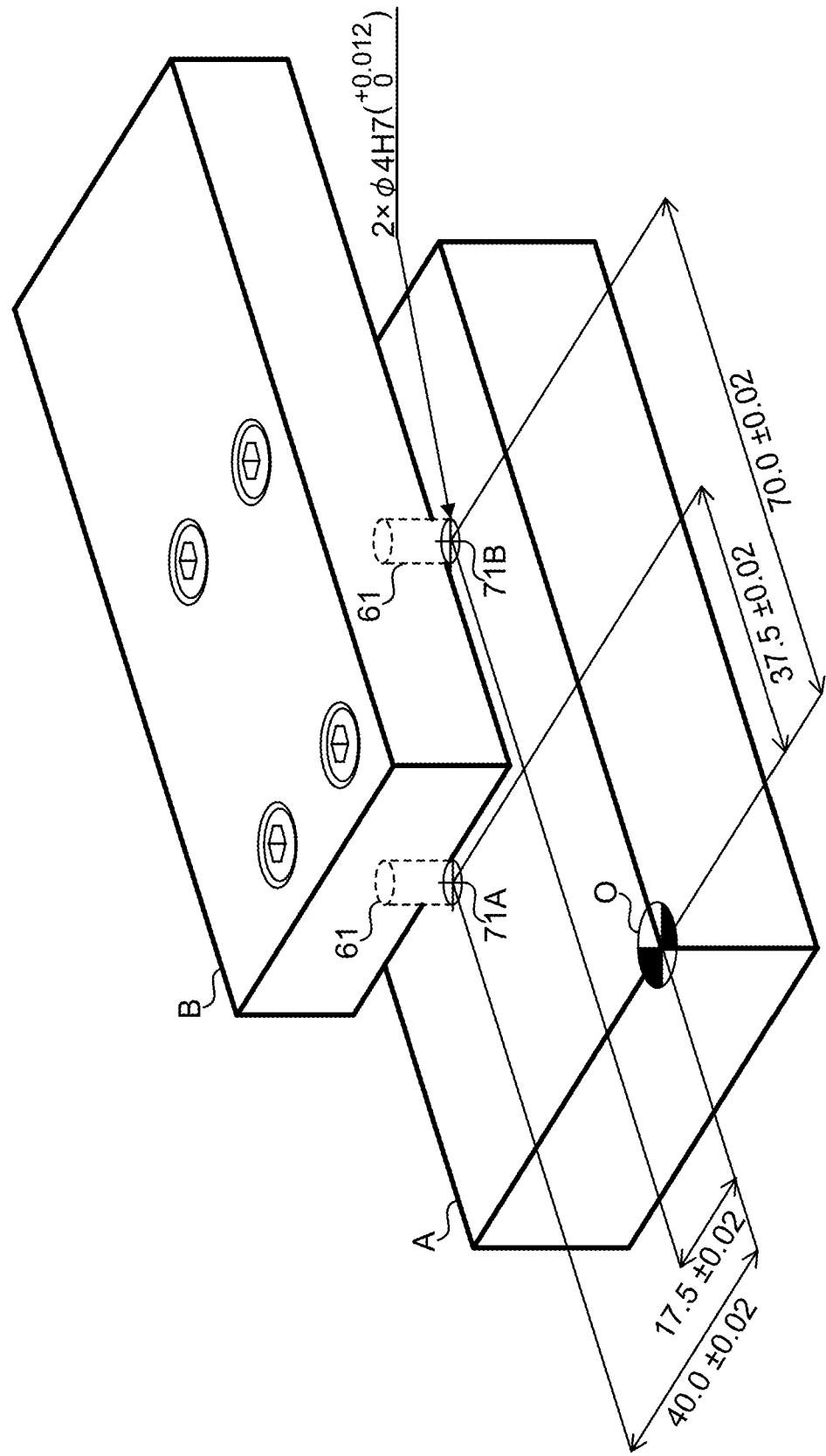
FIG. 2 is an explanatory diagram of an outline of assistance processing.

An outline of the present invention will be described with reference to FIG. 2. Note that in FIG. 2, a positioning pin 61 is illustrated virtually by a dashed line. FIG. 2 illustrates an assembly assembled with aligning two articles A and B. When the upper article B is accurately positioned with respect to the lower article A, the positioning pin 61 mounted to the article A is used. As one example, the stepped positioning pin 61 is inserted into precision holes 71A and 71B formed in the article A. Then, the article B is placed on the article A so that two sides of the article B abut each positioning pin 61. In this state, a bolt is inserted into a counterbore hole formed in the article B and a tap hole formed in the article A to accurately fix the article B to the article A. For example, the counterbore hole formed in the article B is a straight hole in both the upper stage and the lower stage. Then, the bolt is inserted into the counterbore hole and the tap hole while the counterbore hole is formed in the article B and the tap hole is formed in the article A. Then, the article A is fastened by a screw part by the bolt and tap hole. Furthermore, the article B is fixed by the head of the bolt and the bottom surface of the upper stage of the counterbore hole.

Here, the shape data of the article A includes information for identifying the position where the precision holes 71A and 71B, which are one of the elements constituting the article A, are formed. Specifically, a design origin O, which serves as a reference for the position where precision hole 71A is formed, or the distance of the precision hole 71A to the other precision hole 71B (distance of the hole machining position relative to the reference) and the tolerance of this distance are set and are included in the shape data. Moreover, a hole diameter, which is a dimension of the precision holes 71A and 71B, and a tolerance of the hole diameter are set and included in the shape data.

In the example in FIG. 2, a distance of 40.0 mm on a short side relative to the design origin O as a reference and a distance of 37.5 mm on a long side relative to the design origin O are set to the precision hole 71A. Furthermore, a distance of 17.5 mm on a short side relative to the design origin O and a distance of 70.0 mm on a long side relative to the design origin O are set to the precision hole 71B. Moreover, a range of plus 0.02 mm to minus 0.02 mm is set as the tolerance of these distances. Furthermore, a range of mm is set as a hole diameter that is a dimension of the hole, and a range of plus 0.012 mm to 0 mm is set as the tolerance of the hole diameter (hereinafter also referred to as the hole diameter tolerance) for each of the precision holes 71A and 71B. In particular, in the example in FIG. 2, a tolerance zone class "H7" is set as information indicating the hole diameter tolerance, and the hole diameter tolerance is included in the shape data.

In this manner, it is necessary to set a subject that serves as a reference of the position and the tolerance of a distance to the reference as the first tolerance information and to set the tolerance of a hole diameter as the second tolerance information for the precision holes 71A and 71B. Here, the subject that serves as the reference of the position may be another element instead of the design origin O, such as a precision hole, straight hole, tap hole, external plane, machined plane, or the like. In the example in FIG. 2, the reference of the position of the precision hole 71A may be set to the center of the precision hole 71B. Then, conventionally, the subject that serves as the reference of positions and the values of each tolerance are determined and set from a plurality of choices by a user on the basis of experience. Therefore, it is necessary to input a value to the subject determined by the user, which is a cause of prolonged design work. Furthermore, because the user performs input, there is also a possibility that an error may occur, such as input omission or an input mistake.

Thus, the quotation system 100 according to the first embodiment performs assistance processing to assist in the setting of at least one type of multiple types of tolerance information. Specifically, when the user inputs or selects the first tolerance information or the second tolerance information to set for an element and the tolerance zone of first tolerance information or second tolerance information that has been set satisfies a predetermined condition, the quotation system 100 assists in the setting of first tolerance information or second tolerance information that has not been set. For example, when the tolerance zone of the set first tolerance information satisfies a predetermined condition, the quotation system 100 concludes that setting of the second tolerance information is necessary and notifies the user of a candidate for second tolerance information. Furthermore, when the tolerance zone of the set second tolerance information satisfies a predetermined condition, the quotation system 100 concludes that setting of the first tolerance information is necessary and notifies the user of a candidate for the first tolerance information. Here, the notification to the user includes notification by displaying on the screen, notification by voice, and the like. Note that the multiple types of tolerance information include one type of tolerance information and another type of tolerance information, wherein at least one portion of the information differs from the one type of tolerance information.

Moreover, when the tolerance zone of the first tolerance information that has been set satisfies a predetermined condition, the quotation system 100 may conclude that setting of the second tolerance information is necessary and automatically set the second tolerance information. Furthermore, when the tolerance zone of the second tolerance information that has been set satisfies a predetermined condition, the quotation system 100 may conclude that setting of the first tolerance information is necessary and automatically set the first tolerance information. In this manner, because the quotation system 100 assists in the setting of at least one type of the multiple types of tolerance information (for example, the first tolerance information and the second tolerance information), the time required for setting processing may be reduced, and the design work may be shortened. Furthermore, since the quotation system 100 assists in the setting of tolerance information, the possibility that an error may occur, such as input omission or an input mistake by the user, may be reduced. Alternatively, the quotation system 100 may assist in the setting of first tolerance information that has not been set for an element for which the first tolerance information is input or selected to set. Furthermore, the quotation system 100 may assist in the setting of second tolerance information that has not been set for an element for which the second tolerance information is input or selected to set.

Figure 3:
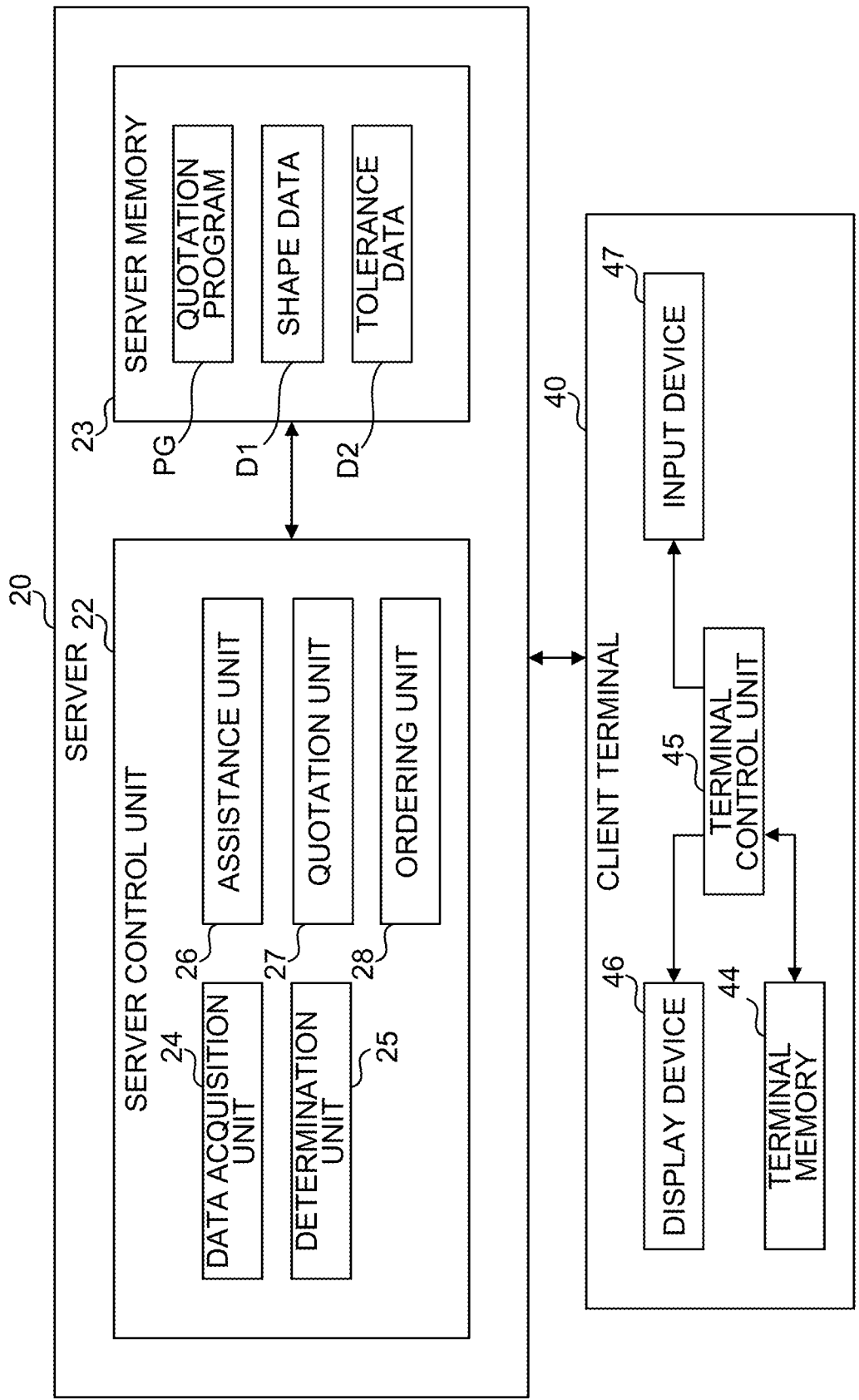
FIG. 3 is a schematic block diagram of the entire quotation system.

Next, a schematic configuration of a control system of the quotation system 100 will be described with reference to FIG. 3. The server 20 is provided with a server control unit 22 as control means and a server memory 23 as storage means. The server control unit 22 is configured as a computer that combines a processor for executing various kinds of arithmetic processing and operation control according to a predetermined program, internal memory necessary for the operation of the processor, and other peripheral devices. The processor is, for example, a CPU (Central Processing Unit) or an MPU (Micro-Processing Unit), and it controls the entire device on the basis of a control program stored in the server memory 23 and also provides overall control regarding various kinds of processing. Moreover, the server control unit 22 executes various kinds of processing accompanying the quotation of the price of an article on the basis of a quotation program PG stored in the server memory 23.

The server memory 23 includes RAM (Random Access Memory), which is system work memory for the processor to operate, and a storage device such as ROM (Read Only Memory), an HDD (Hard Disk Drive), and an SSD (Solid State Drive) for storing the program and system software. However, the server memory 23 is not limited to the example provided as one portion of the server 20, and may be provided as a database server that cooperates with the server 20. In the present embodiment, a CPU executes processing operations such as various calculations, controls, distinctions, and the like according to a control program stored in the ROM or HDD.

Furthermore, the server memory 23 stores shape data D1 of an article and tolerance data D2. Then, in the tolerance data D2, multiple types of tolerance information relating to the elements are associated with each other. Specifically, in the tolerance data D2, the first tolerance information and the second tolerance information are associated with each other. Moreover, in the tolerance data D2, multiple types of first tolerance information may be associated with each other, and multiple types of second tolerance information may be associated with each other. As one example, the tolerance data D2 is a table or a list wherein the first tolerance information and the second tolerance information are associated. The table or list may be prepared by the user. For example, the user may set in advance the setting subject, value, or the like of the first tolerance information or the second tolerance information to be notified to the user or automatically set by an assistance unit 26. Furthermore, the table or list may be prepared by the server 20 on the basis of the prerecorded shape data D1. Alternatively, the tolerance data D2 may be a table or a list prepared by the user in advance, or the server 20 may determine the tolerance data D2 on the basis of the history of the first tolerance information and the second tolerance information set by the user in the past. Moreover, the tolerance data D2 may be first tolerance information and second tolerance information set to elements of other shape data. In this case, the assistance unit 26 of the server 20 acquires the first tolerance information or the second tolerance information by referring to the other shape data.

Furthermore, an operation unit, not illustrated, including a keyboard or various kinds of switches for inputting predetermined commands and data is wired or wirelessly connected to the server control unit 22. Furthermore, a display unit, not illustrated, that displays the input state, setting state, measurement result, and various kinds of information of the server device is wired or wirelessly connected to the server control unit 22. Note that the server control unit 22 is also capable of performing control according to a program stored in a portable recording medium, such as a CD (Compact Disc), a DVD (Digital Versatile Disc), a CF (Compact Flash) card, and a USB (Universal Serial Bus) memory, or an external storage medium, such as a cloud server on the Internet.

The quotation program PG causes the computer to function as a data acquisition unit 24 that is data acquisition means, a determination unit 25 that is determination means, an assistance unit 26 that is assistance means, a quotation unit 27 that is quotation means, and an ordering unit 28 that is ordering means. That is, the server control unit 22 includes the data acquisition unit 24, the determination unit 25, the assistance unit 26, the quotation unit 27, and the ordering unit 28 as a logical device that is realized by combining computer hardware and software. The quotation program PG may be stored in a computer-readable non-transitory storage medium.

Note that in addition to the foregoing logical device, the server control unit 22 has a logical device and the like, not illustrated, that controls switching and the like of the display of a web page according to an operation of the client terminal 40. Furthermore, the server memory 23 records various kinds of data, not illustrated, such as image data used for displaying a web page, data including information such as the model number, name, characteristic, or the like of a product or an article, and the like.

The data acquisition unit 24 acquires the shape data D1 of an article uploaded by a user from the server memory 23. As one example, the server control unit 22 receives the shape data D1 of an article constituted from a plurality of elements from the client terminal 40 in accordance with an upload by the user. Then, the server control unit 22 stores the shape data D1 uploaded by the user in the server memory 23. Specifically, in the shape data D1, a tolerance zone class for an element is set as second tolerance information for the element (a hole or axis as one example). Furthermore, in the shape data D1, first tolerance information for the element is set. Alternatively, the data acquisition unit 24 may acquire the shape data D1 from the terminal memory 44 of the client terminal 40.

The determination unit 25 determines whether the tolerance zone of the first tolerance information or the second tolerance information set for at least one element of the shape data D1 satisfies a predetermined condition. Specifically, when the first tolerance information is set for an element, the determination unit 25 determines whether the tolerance zone of the first tolerance information satisfies a predetermined condition. Furthermore, when the second tolerance information is set for an element, the determination unit 25 determines whether the tolerance zone of the second tolerance information satisfies a predetermined condition. Note that the determination unit 25 may determine whether the tolerance zone satisfies a predetermined condition on the basis of a tolerance zone established by a standard such as JIS (Japanese Industrial Standards) or ISO (International Organization for Standardization).

As one example, when the tolerance of the distance from the design origin O to a hole that is one element is set, the determination unit 25 determines whether the tolerance zone of the tolerance satisfies a predetermined condition. Furthermore, when the tolerance of the hole diameter is set, the determination unit 25 determines whether the tolerance zone of the tolerance satisfies a predetermined condition. For example, when the tolerance zone class of the second tolerance information of the hole is of a higher precision than "H8" (that is, when the tolerance is more severe than "H8") the determination unit 25 concludes that the tolerance zone of the second tolerance information satisfies a predetermined condition. As yet another example, when the tolerance zone class of the second tolerance information of the axis is of a higher precision than "h8" (that is, when the tolerance is more severe than "h8") the determination unit 25 concludes that the tolerance zone of the second tolerance information satisfies a predetermined condition.

Note that generally the first tolerance information or the second tolerance information is set to an element to which the second tolerance information or the first tolerance information indicating high precision is set. Therefore, when the second tolerance information or first tolerance information is set for the element, the determination unit 25 determines that the tolerance zone satisfies a predetermined condition. Furthermore, when the first tolerance information is set for a hole, the determination unit 25 may determine that the tolerance zone of the first tolerance information satisfies a predetermined condition. Alternatively, when the second tolerance information is set for a hole, the determination unit 25 determines that the tolerance zone of the second tolerance information satisfies a predetermined condition.

When it is determined that the tolerance zone satisfies a predetermined condition, the assistance unit 26 performs assistance processing for assisting in the setting of at least one of the first tolerance information and the second tolerance information with respect to the elements of the article on the basis of the tolerance data D2. Specifically, when the second tolerance information is set for an element and the determination unit 25 determines that a predetermined condition is satisfied, the assistance unit 26 notifies the user of the first tolerance information that may be set for the element or automatically sets the same to the shape data D1. Furthermore, when the first tolerance information is set for an element and the determination unit 25 determines that a predetermined condition is satisfied, the assistance unit 26 notifies the user of the second tolerance information that may be set for the element or automatically sets the same to the shape data D1. Moreover, when one type of first tolerance information is set for an element and the determination unit 25 determines that a predetermined condition is satisfied, the assistance unit 26 notifies the user of another type of first tolerance information that may be set for the element or automatically sets the same to the shape data D1. Furthermore, when one type of second tolerance information is set for an element and the determination unit 25 determines that a predetermined condition is satisfied, the assistance unit 26 notifies the user of another type of second tolerance information that may be set for the element or automatically sets the same to the shape data D1.

For example, the assistance unit 26 notifies the user of the origin or element subject to a geometric reference, the tolerance of the distance from the geometric reference, a cylinder subject to the geometric reference, and the coaxiality as the first tolerance information that may be set or sets the same to the shape data D1. Furthermore, the assistance unit 26 notifies the user of the tolerance zone class relating to the element as the second tolerance information that may be set or sets the same to the shape data D1. In particular, the assistance unit 26 causes the server control unit 22 to display the first tolerance information or second tolerance information on the display device 46 of the client terminal 40. The assistance unit 26 thereby notifies the user of the first tolerance information or the second tolerance information.

That is, the assistance unit 26 causes the server control unit 22 to display on the screen a candidate for a value of the first tolerance information or the second tolerance information, or a candidate for a setting subject of the first tolerance information or the second tolerance information. The assistance unit 26 thereby notifies the user of each candidate. Furthermore, the assistance unit 26 performs automatic setting by including the value of the first tolerance information or the second tolerance information or the setting subject of the geometric reference in the shape data D1 stored by the server memory 23 in association with the element. Here, the setting subject of the geometric reference may be identified on the basis of unique identification information (for example, an element ID) set in each element.

The ordering unit 28 performs order processing of an article corresponding to the shape data D1. During order processing, for example, the ordering unit 28 identifies the model number of the article and prepares an order screen as a web page for ordering the article corresponding to the identified model number, and the server control unit 22 causes the display device 46 of the client terminal 40 to display the order screen. Then, when the user orders an article, the ordering unit 28 transmits the identified model number and the purchase quantity to the manufacturer of the article. One example of a quotation screen that is a web page of the previous stage of the order screen is illustrated in FIG. 4.

FIG. 4 is one example of a quotation screen displayed on the display device 46 of the client terminal 40, and the quotation unit 27 prepares the quotation screen. This quotation screen is displayed on the display device 46 of the client terminal 40, and the quotation system 100 thereby provides the quotation information of the article to the user of the client terminal 40. As illustrated in FIG. 4, the quotation screen also includes a basic information tab 11 and a tree view tab 12. In a basic information view that is displayed by selecting the basic information tab 11, information necessary for manufacturing, for example, a material, a surface processing method, and the like and the purchase quantity are displayed. In the example in FIG. 4, a tree view 13 displayed by selecting the tree view tab 12 is illustrated. In the tree view 13, for example, an external dimension of the article and machining contents of each plane (upper plane, bottom plane, front plane, back plane, left plane, and right plane) of the article are displayed. Note that FIG. 4 is a reference diagram, and the information of the dimensions and the like illustrated in the tree view 13 is different from the information set with respect to the article A according to the present embodiment.

In the example in FIG. 4, a dimension of "100 mm" in the X direction, a dimension of "60 mm" in the Y direction, and a dimension of "20 mm" in the Z direction are displayed as information illustrating the external dimensions of the article A. Furthermore, "4×M10" is displayed as information illustrating that a tap hole corresponding to "M10" defined by the JIS Standards is machined in four locations on an upper plane (top) of the article A. Furthermore, "Y 30 mm" is displayed as information indicating that a slot having a width of 30 mm in the Y direction is machined. Furthermore, "4,980 yen" is displayed as the price of one article A. Moreover, "6 days" is displayed as the number of actual work days required until shipment.

Moreover, a confirm button 14 for quotation is displayed at a lower portion of the quotation screen, and when the user selects the confirm button 14, a total monetary amount, a ship date, and a number of actual work days required until shipment are displayed below the confirm button 14. At this time, a monetary amount obtained by multiplying the price of the article by the purchase quantity is displayed on the quotation screen as the total monetary amount. Moreover, a model number corresponding to the displayed article is displayed in a model number section 15. Furthermore, a print button 16 is displayed below the confirm button 14, and the quotation result may be printed when the user selects the print button 16. Moreover, an output button 17 and an order button 18 are displayed in parallel to the print button 16.

When the user selects the output button 17, the electronic data of the order list may be output. Furthermore, when the user selects the order button 18, an order screen (not illustrated) for performing an order is displayed by the display device 46 of the client terminal 40. The user may order an article identified by a model number on the order screen. When the user orders an article, the ordering unit 28 transmits the identified model number and the purchase quantity to the manufacturer of the article. Moreover, the ordering unit 28 may execute processing for transmitting a delivery instruction for an article to the manufacturer and processing for billing the user for the purchase price. Alternatively, when the user selects the order button 18 on the quotation screen, the ordering unit 28 may transmit the identified model number and the purchase quantity to the manufacturer of the article without causing a further operation screen to be displayed.

Returning to FIG. 3, a configuration of the client terminal 40 will be described. The client terminal 40 is provided with a terminal control unit 45 for controlling the client terminal 40, and the terminal memory 44 wherein the control program is stored. The terminal control unit 45 is a computer that combines a processor for executing various kinds of arithmetic processing and operation control according to a predetermined program, and other peripheral devices. Furthermore, the client terminal 40 is provided with the display device 46 and an input device 47.

As one example, the processor of the terminal control unit 45 is, for example, a CPU or an MPU, and it controls the entire device on the basis of a control program stored in the terminal memory 44 and also provides overall control regarding various kinds of processing. Furthermore, the terminal memory 44 includes RAM, which is system work memory for the processor to operate, and a storage device such as ROM, an HDD, an SSD, and the like for storing the program and system software. In the present embodiment, a CPU executes processing operations such as various calculations, controls, distinctions, and the like according to a control program stored in the ROM or HDD. Furthermore, the terminal control unit 45 is also capable of performing control according to a program stored in a portable recording medium, such as a CD, a DVD, a CF card, and a USB memory, or an external storage medium, such as a cloud server on the Internet.

The terminal memory 44 is an external storage device including a nonvolatile storage medium (computer-readable non-transitory storage medium), such as a hard disk and a semiconductor storage device. Moreover, the terminal memory 44 stores, in addition to the control program, a design program for preparing the shape data D1, such as CAD software, and various kinds of programs, such as a web browser.

The input device 47 is a keyboard, numeric keypad, and touch panel, and the like, and the user prepares or changes the shape data D1 using the input device 47. Then, the shape data D1 prepared using the input device 47 is recorded in the terminal memory 44. Furthermore, when receiving an article image corresponding to the shape data D1 from the server 20, the display device 46 displays the article image. Moreover, the display device 46 displays a web page, such as a setting screen, a quotation screen, and an order screen. The user orders the article according to the web page displayed on the display device 46.

Figure 5:
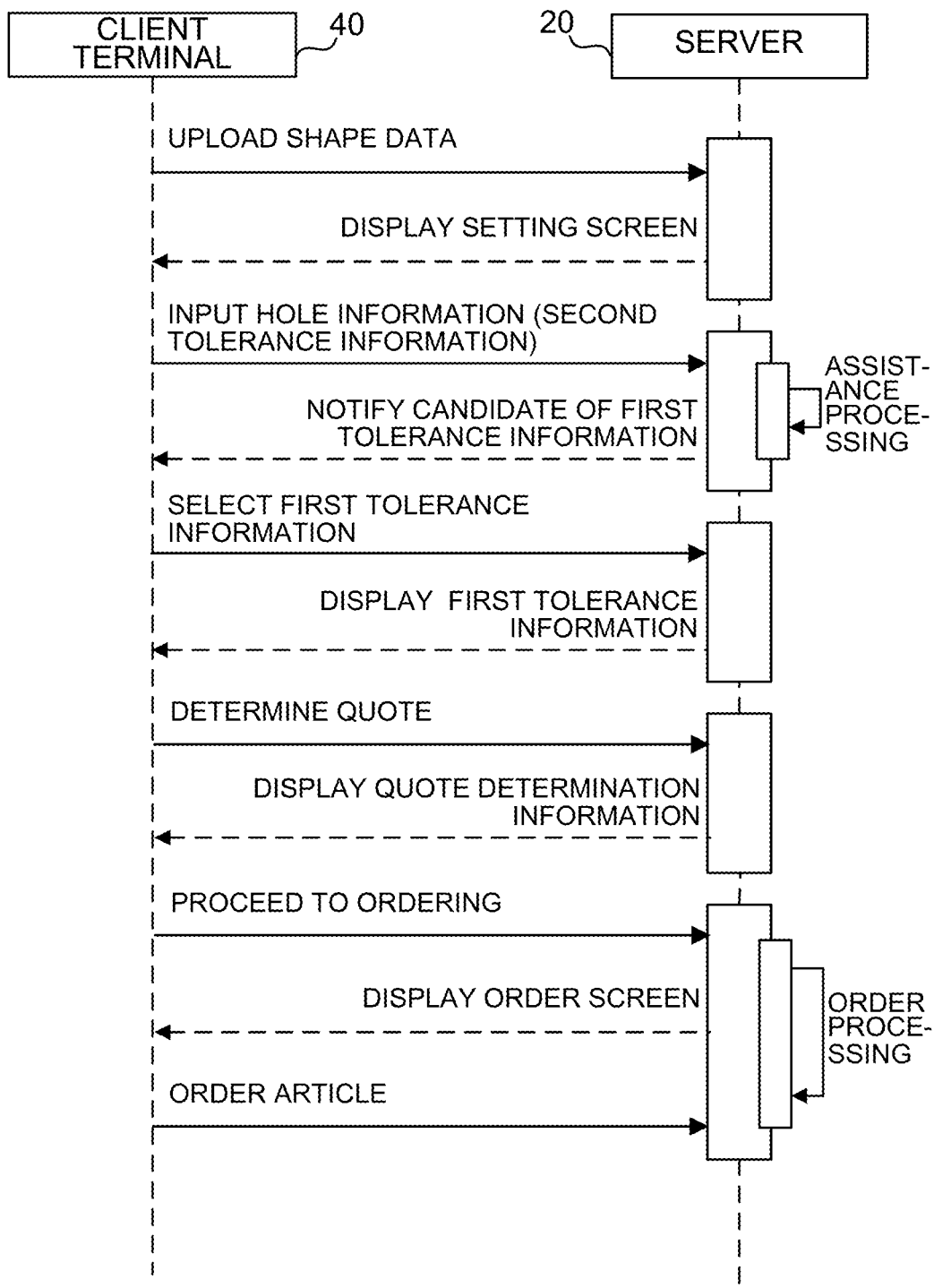
FIG. 5 is a sequence diagram of processing in a first embodiment.
Figure 6:
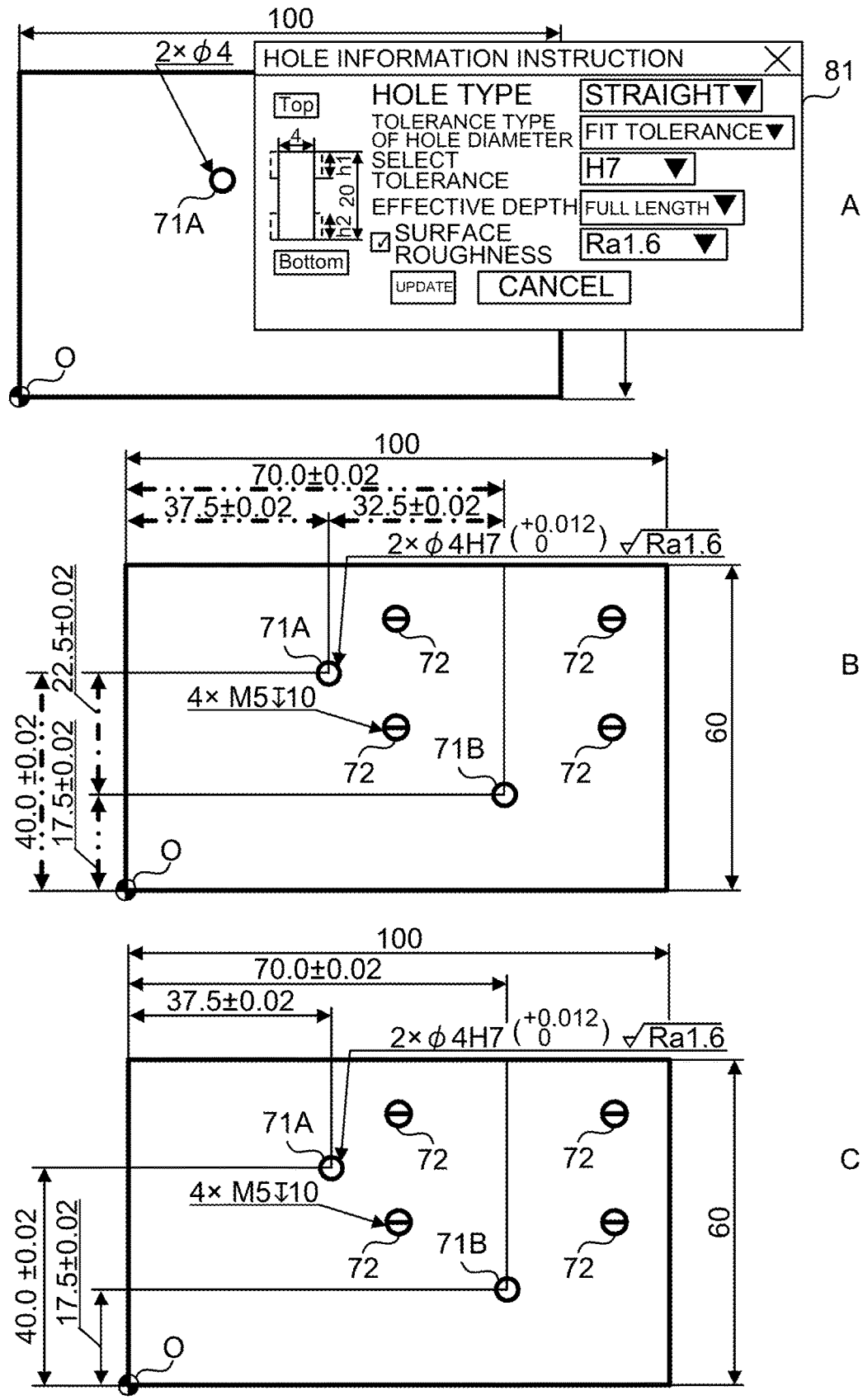
FIG. 6 is a diagram illustrating one example of a setting screen according to the first embodiment.

Next, design processing in the first embodiment will be described with reference to FIG. 5 and FIG. 6. Design processing includes each processing performed from upload of the shape data D1 to order processing. First, when the user uploads shape data D1 from the client terminal 40, the server control unit 22 of the server 20 stores the shape data D1 in the server memory 23. Then, the server control unit 22 displays a setting screen, which is a web page displaying an article image, on a display device 46 of the client terminal 40. The user inputs and sets various kinds of information, such as hole information, on the setting screen displayed on the display device 46 of the client terminal 40. One example of the setting screen is illustrated in FIGS. 6A, B, and C.

For example, the server control unit 22 acquires the number and hole diameter set in the hole 71A, which is an element, from the shape data D1 and causes the setting screen illustrated in FIG. 6A to display the same. When the user selects the hole 71A, which is subject to setting, the server control unit 22 displays a hole information instruction screen 81 as a pop up. Then, the user selects and inputs the hole information on the hole information instruction screen 81. Specifically, the user selects "straight", which is a hole type which does not undergo tap machining. Furthermore, the user selects "fit tolerance", which is the tolerance when other members such as the positioning pin 61 and the hole are fitted together, as the tolerance type of the hole diameter. Moreover, the user selects "H7", which is the tolerance zone class of the hole, as the second tolerance information. The hole information input to the hole 71A by the user on the hole information instruction screen 81 is also set to the hole 71B. Alternatively, the user may select the hole 71B and execute selection and input of the hole information. For example, similarly to the hole 71A, the user may select and input hole information for the hole 71B on the hole information instruction screen 81 displayed when selecting the hole 71B. Note that in FIG. 6A, the hole 71B is hidden below the hole information instruction screen 81.

Furthermore, the user selects "full length" corresponding to the length (for example, 20 mm) of the entire article that is subject to machining as the effective depth of the precision hole 71A. Moreover, the user selects "Ra 1.6", which is the arithmetic average roughness, as the surface roughness of an inner plane of the precision hole 71A. Furthermore, an update button and a cancel button are displayed below a selection section for various kinds of information. When the user selects the update button, the server control unit 22 sets the selected various kinds of information to the shape data D1. Meanwhile, when the user selects the cancel button, the server control unit 22 closes the hole information instruction screen 81.

The server control unit 22 changes the shape data D1 so as to include various kinds of information and stores it in a server memory 23. Then, the data acquisition unit 24 acquires the shape data D1, wherein the various kinds of information are set, from the server memory 23. Here, the first tolerance information is generally set in the precision hole 71A where the second tolerance information indicates high accuracy. Thus, assistance processing is performed to aid in the setting of the first tolerance information. Therefore, the server memory 23 stores tolerance data D2 wherein first tolerance information relating to the position of a hole and second tolerance information relating to the dimensions of the hole are associated with each other. Furthermore, the determination unit 25 of the server 20 determines whether the tolerance zone set for the precision hole 71A of the shape data D1 satisfies a predetermined condition. In the example in FIG. 6A, "H7", which is a high precision tolerance zone class, is set for the precision hole 71A. Therefore, the determination unit 25 determines that the tolerance zone of the precision hole 71A satisfies a predetermined condition and that setting of the first tolerance information is necessary.

When it is determined that the tolerance zone satisfies a predetermined condition, the assistance unit 26 of the server 20 performs assistance processing for assisting in the setting of the first tolerance information on the basis of the tolerance data D2. In the example in FIG. 6B, the assistance unit 26 notifies the user of first tolerance information that may be set for the precision holes 71A and 71B as assistance processing. That is, the assistance unit 26 causes the server control unit 22 to display on the setting screen a value candidate of a tolerance value and a position candidate that is a candidate of a setting subject of a reference as first tolerance information that is capable of being set. For example, the assistance unit 26 acquires, from the tolerance data D2, first tolerance information associated with the tolerance zone class "H7", which is the second tolerance information. Then, the assistance unit 26 causes the server control unit 22 to display on the display device 46 the obtained first tolerance information as a position candidate and value candidate. Note that in the example in FIG. 6B, because the hole information set to the precision hole 71A is also set to the precision hole 71B, candidates for the precision hole 71B are also displayed. Alternatively, the assistance unit 26 may cause the server control unit 22 to display candidates for only one of the precision holes 71A and 71B.

Here, the reference in the first tolerance information is at least one of the design origin O, which is an origin set in the shape data D1, and the precision hole 71B, which is another element different to the precision hole 71A that is an element. In the example in FIG. 6B, in the tolerance data D2, four distances from the design origin O as a reference, two distances from the precision hole 71B as a reference, and the value of the tolerance of each distance are associated with the second tolerance information as the first tolerance information corresponding to the second tolerance information "H7". Thus, the assistance unit 26 causes the server control unit 22 to display four candidates indicated by a two-dot chain line as position candidates for which the design origin O is a reference. Furthermore, the assistance unit 26 causes the server control unit 22 to display two candidates indicated by a one-dot chain line as position candidates for which the precision hole 71B, which is another element, is a reference. Moreover, the assistance unit 26 causes the server control unit 22 to display plus/minus "0.02" as respective value candidates.

Then, the user selects a desired candidate from the position candidates and the value candidates. For example, the user may select each candidate by matching the cursor to the desired candidate and clicking. The server control unit 22 sets the selected candidate to the shape data D1 and causes the display device 46 to display the set first tolerance information. FIG. 6C illustrates an example where the user selects a position candidate for which the design origin O is a reference and selects a value candidate of plus/minus "0.02". Note that when there is no desired candidate, the user may change a reference of the tolerance. For example, the user may click the design origin O to change its position. Moreover, when there is no desired tolerance value, the user may change the displayed value candidate and input the tolerance value.

Note that in FIG. 6A, selection sections for hole type, hole diameter tolerance type, tolerance selection, effective depth, and surface roughness are displayed so that the user may select various kinds of information. Furthermore, in FIG. 6B, a plurality of position candidates and value candidates is displayed so that a user may select various kinds of information. However, in FIGS. 6A and B, an input section where the user inputs various kinds of information may be displayed. Moreover, when there is a plurality of candidates (for example, a plurality of value candidates), the assistance unit 26 causes the server control unit 22 to display the candidates on the display device 46 so that any of the candidates may be selected. For example, when there is a plurality of corresponding candidates, the assistance unit 26 causes the server control unit 22 to display at least one of the plurality of candidates. Furthermore, the assistance unit 26 may cause the server control unit 22 to display all of the plurality of candidates, and may cause the server control unit 22 to display the plurality of candidates in a drop-down menu format. Note that when there are no corresponding candidates, the assistance unit 26 may cause the server control unit 22 to display the input section of the first tolerance information or the second tolerance information.

Furthermore, in FIGS. 6A, B, and C, the character string of "4×M5" and information indicating that the effective depth is 10 mm are displayed for holes 72 other than the precision holes, and the character string indicates that a tap hole corresponding to "M5" established by the JIS Standard will be machined in each of four locations. Furthermore, FIGS. 6A, B, and C display information indicating that the X direction dimension of the article A is 100 mm and the Y direction dimension of the article A is 60 mm.

Returning to FIG. 5 and describing further, when the server control unit 22 causes the display device 46 to display the setting screen (FIG. 6A) and the user selects and inputs the second tolerance information, the data acquisition unit 24 acquires the shape data D1. Then, the assistance unit 26 notifies the user of a candidate for the first tolerance information as assistance processing to assist in the setting of the first tolerance information to the hole, which is an element, on the basis of the tolerance data D2 (FIG. 6B). Next, when the user selects the first tolerance information, the server control unit 22 sets the selected various kinds of information to the shape data D1. Then, the server control unit 22 causes the display device 46 to display the set first tolerance information to notify the user. Thereafter, the user confirms the displayed contents and determines a quote. In response to this, the server control unit 22 causes the display device 46 to display quote determination information such as the model number, ship date, the actual work days, and the like. Then, when the user selects the order button 18 and proceeds to ordering, an ordering unit 28 of the server 20 performs order processing, and the server control unit 22 causes the display device 46 to display the order screen. Then, when the user orders an article, the ordering unit 28 transmits the identified model number and the purchase quantity to the manufacturer of the article.

According to the first embodiment described above, candidates of tolerance information that is capable of being set can be notified to the user. Therefore, it is possible to reduce the time for input processing by the user and to shorten the processing time required for design processing accompanying the quotation of an article. Moreover, since the candidates for tolerance information that are capable of being set are automatically notified to the user, the occurrence of errors accompanying the setting of tolerance information may be suppressed.

[Variations]

As one example of a variation, the assistance unit 26 may automatically set first tolerance information that is capable of being set for an element to the shape data D1. In this case, when it is determined that the tolerance zone satisfies a predetermined condition, the assistance unit 26 selects, as assistance processing based on the tolerance data D2, any of first tolerance information that is capable of being set for the precision holes 71A and 71B. As one example, the assistance unit 26 refers to the past shape data uploaded by the user or the tolerance setting history of the user as tolerance data D2. Then, the assistance unit 26 selects first tolerance information that have been set at the nearest timing from the first tolerance information that is capable of being set. Alternatively, the assistance unit 26 refers to the past shape data uploaded by the user or the tolerance setting history of the user as tolerance data D2. Then, the assistance unit 26 selects the first tolerance information that have been most used from the first tolerance information that is capable of being set.

Then, the assistance unit 26 sets the first tolerance information selected as illustrated in FIG. 6C to the shape data D1 without causing the server control unit 22 to display the candidate illustrated in FIG. 6B. Moreover, the assistance unit 26 causes the server control unit 22 to display the set first tolerance information on the display device 46. When there is no desired first tolerance information, the user may change the displayed first tolerance information. Thus, the tolerance information that is capable of being set by the user may be automatically set. Therefore, it is possible to reduce the time for input processing by the user and to shorten the processing time required for design processing accompanying the quotation of an article. Moreover, since the tolerance information that is capable of being set is automatically set, the occurrence of errors accompanying the setting of tolerance information may be suppressed.

As another example of a variation, the assistance unit 26 may notify the user of both the first tolerance information and the second tolerance information that is capable of being set for an element or automatically set the same to the shape data D1. For example, the user prepares in advance tolerance data D2 wherein first tolerance information and second tolerance information corresponding to the material and the hole diameter are associated with each other. The tolerance data may further include the type of hole, hole diameter tolerance type, effective depth, and surface roughness. As one example, the user prepares tolerance data D2 as described in Table 1 below.

TABLE 1

| Material | Hole diameter | Hole type | First tolerance data | Second tolerance data | Effective depth |
|---|---|---|---|---|---|
| Iron | φ4 | Straight | ±0.02 | H7 | Full length |
| Aluminum | φ4.5 | Straight | No tolerance | No tolerance | — |

An assistance unit 26 performs assistance processing when shape data D1, to which a hole including a material and a hole diameter set to the tolerance data D2 is set, is uploaded. In this case, the assistance unit 26 identifies first tolerance information and second tolerance information predetermined for the hole as assistance processing based on the tolerance data D2. Then, the assistance unit 26 causes the server control unit 22 to display on the display device 46 the identified first tolerance information and second tolerance information as candidates, similar to the aspect illustrated in FIG. 6B. Thereafter, the user selects a desired candidate from the position candidates and the value candidates. The server control unit 22 sets the selected candidate to the shape data D1 and causes the display device 46 to display the set first tolerance information and second tolerance information.

Alternatively, the assistance unit 26 may automatically set the identified first tolerance information and second tolerance information as illustrated in FIG. 6C to the shape data D1 without causing the server control unit 22 to display the candidate illustrated in FIG. 6B. In this case, the assistance unit 26 causes the server control unit 22 to display the set first tolerance information on the display device 46. When there is no desired first tolerance information and second tolerance information, the user may change the displayed first tolerance information and second tolerance information. Moreover, the assistance unit 26 may refer to past shape data uploaded by the user or the tolerance setting history of the user as tolerance data D2, and notify the user of both of the first tolerance information and the second tolerance information or automatically set the same to the shape data D1.

Thus, it is possible to notify the user of tolerance information that is capable of being set or to automatically set the same by the user simply uploading the shape data D1. Therefore, it is possible to reduce the time for input processing by the user and to shorten the processing time required for design processing accompanying the quotation of an article. Moreover, since the tolerance information that is capable of being set is notified to the user or automatically set, the occurrence of errors accompanying the setting of tolerance information may be suppressed.

Figure 7:
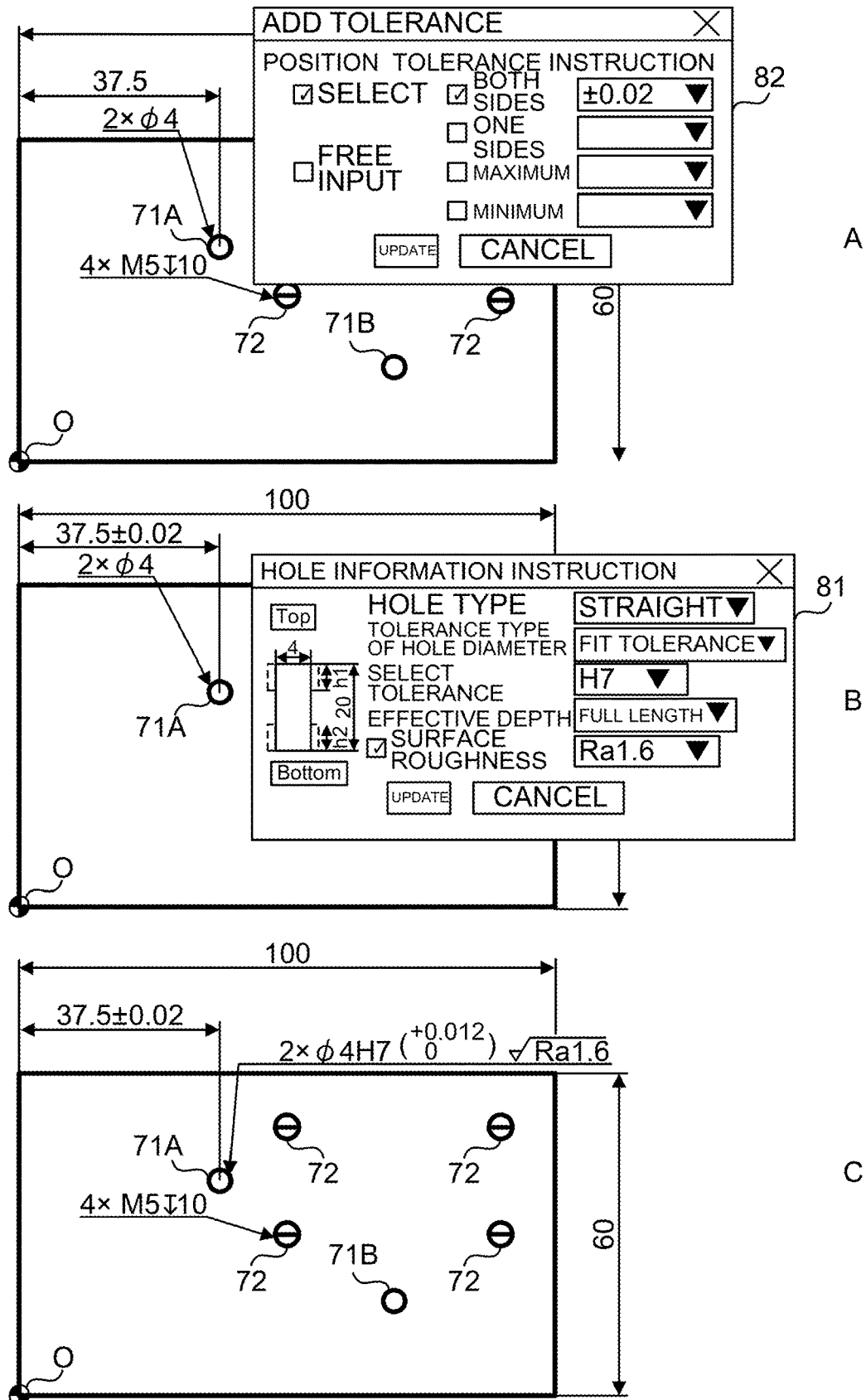
FIG. 7 is a diagram illustrating another example of the setting screen according to the first embodiment.

A further other example of a variation will be described with reference to FIGS. 7A, B, and C. In the example of FIG. 7A, B, C, the user inputs the first tolerance information to the holes 71A and 71B. First, the server control unit 22 causes the display device 46 of the client terminal 40 to display a setting screen. Then, the user inputs and sets the first tolerance information on the setting screen.

For example, the server control unit 22 acquires the number and hole diameter set in the hole 71A from the shape data D1 and causes the setting screen displayed by the display device 46 of the client terminal 40, illustrated in FIG. 7A, to display the same. When the user selects the hole 71A, which is subject to setting, the server control unit 22 displays a first tolerance information instruction screen 82 as a pop up. Then, the user selects and inputs the first tolerance information on the first tolerance information instruction screen 82. Specifically, the user inputs a range of plus 0.02 mm to minus 0.02 mm. That is, the user selects a range of plus 0.02 mm to minus 0.02 mm as the first tolerance information of the hole 71A for which the design origin O is a reference.

When the user selects the first tolerance information, the server control unit 22 changes the shape data D1 so as to include the first tolerance information and stores it in the server memory 23. Moreover, as illustrated in FIG. 7B, the server control unit 22 causes the display device 46 to display the input first tolerance information. Then, the data acquisition unit 24 acquires the shape data D1, wherein the first tolerance information is set, from the server memory 23. Here, the second tolerance information is generally set to the hole wherein the first tolerance information is set. Thus, assistance processing is performed to aid in the setting of the second tolerance information. Therefore, the determination unit 25 determines whether the tolerance zone satisfies a predetermined condition.

Specifically, when the first tolerance information is set, the determination unit 25 determines that the tolerance zone satisfies a predetermined condition. Alternatively, the determination unit 25 may determine whether a tolerance value smaller than the predetermined value is set. In the example in FIG. 7B, the first tolerance information is set for the hole 71A. Therefore, the determination unit 25 determines that the tolerance zone of the hole 71A satisfies a predetermined condition and that setting of the second tolerance information is necessary.

When it is determined that the tolerance zone satisfies a predetermined condition, the assistance unit 26 performs assistance processing for assisting in the setting of the second tolerance information on the basis of the tolerance data D2. Therefore, the server control unit 22 displays the hole information instruction screen 81 as a pop up. Then, in the example in FIG. 7B, as assistance processing, the assistance unit 26 notifies the user of second tolerance information "H7" that is capable of being set for the hole 71A. In the displayed hole information instruction screen 81, the user selects hole information and second tolerance information in the same manner as the content described above. Then, when the user selects the update button, the server control unit 22 changes the shape data D1 so as to include various kinds of information and stores it in the server memory 23.

The server control unit 22 causes the display device 46 to display the selected hole information and second tolerance information. FIG. 7C illustrates an example wherein the user selects the second tolerance information "H7". Moreover, when there is no desired second tolerance information, the user may change the displayed value candidate and input the tolerance value. Thereafter, the user inputs the first tolerance information of the precision hole 71B similarly to the precision hole 71A and selects and sets the second tolerance information. Note that the assistance unit 26 may also notify the user of second tolerance information set for the precision hole 71A as second tolerance information of the precision hole 71B.

Alternatively, the assistance unit 26 may automatically set second tolerance information that is capable of being set for the element to the shape data D1. In this case, when it is determined that the tolerance zone satisfies a predetermined condition, the assistance unit 26 selects, as assistance processing based on the tolerance data D2, any of second tolerance information that is capable of being set for the precision holes 71A and 71B. Then, the assistance unit 26 sets the second tolerance information selected, similarly to the aspect illustrated in FIG. 7C, to the shape data D1 without causing the server control unit 22 to display the candidate illustrated in FIG. 7B. Moreover, the assistance unit 26 causes the server control unit 22 to display the set second tolerance information on the display device 46. When there is no desired second tolerance information, the user may change the displayed second tolerance information.

Thus, the tolerance information that is capable of being set by the user may be notified to the user or automatically set. Therefore, it is possible to reduce the time for input processing by the user and to shorten the processing time required for design processing accompanying the quotation of an article. Moreover, since the tolerance information that is capable of being set is notified to the user or automatically set, the occurrence of errors accompanying the setting of tolerance information may be suppressed. Note that in FIGS. 7A, B, and C, only the first tolerance information in the X direction is set for the hole 71A, but the user may also select and input the first tolerance information in the Y direction.

Second Embodiment

Figure 8:
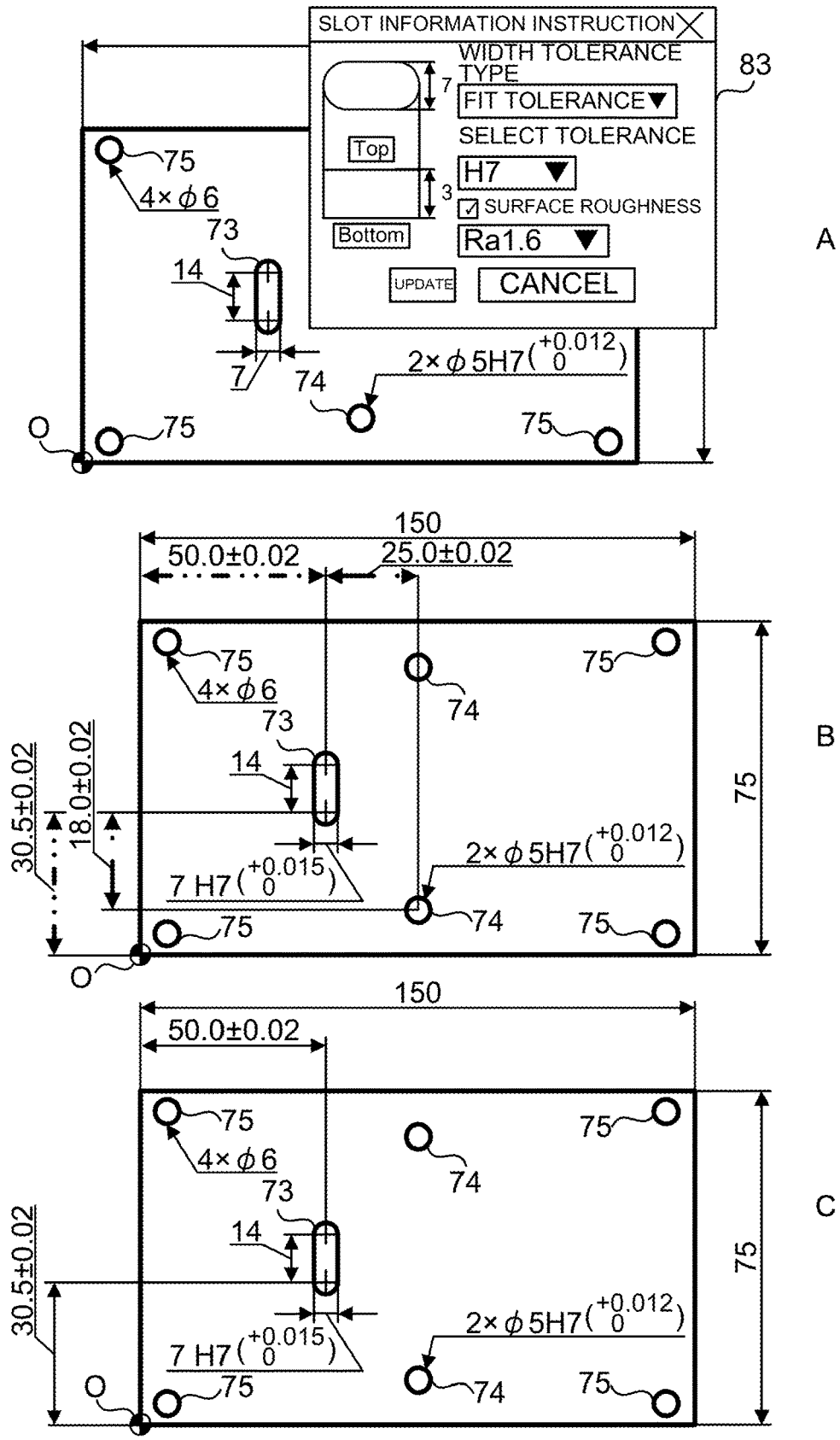
FIG. 8 is a diagram illustrating one example of the setting screen according to a second embodiment.
Figure 9:
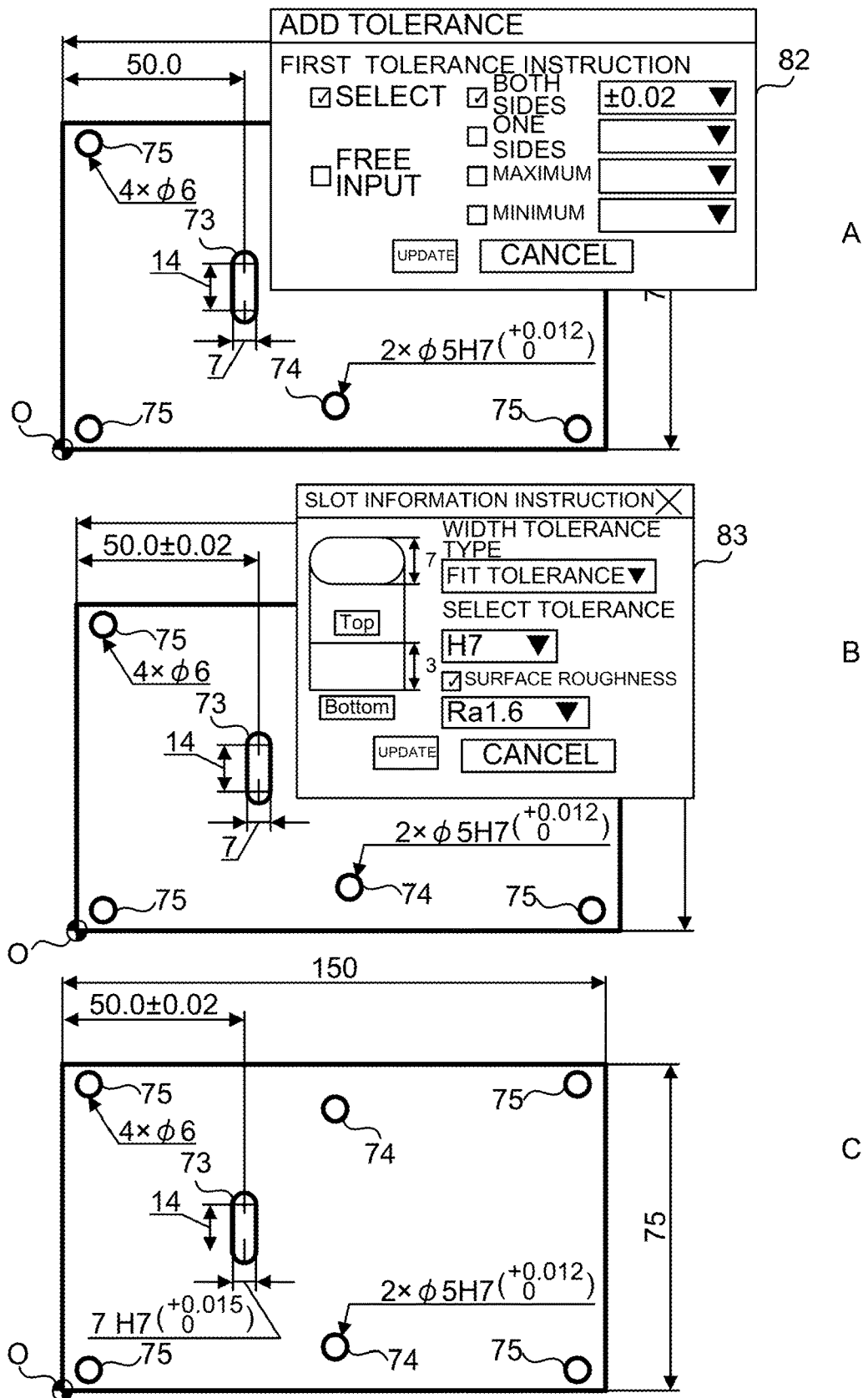
FIG. 9 is a diagram illustrating another example of the setting screen according to the second embodiment.

A second embodiment will be described with reference to FIG. 8 and FIG. 9. The second embodiment differs from the first embodiment in that a slot (oblong hole) is included as an element of an article. The slot (hereinafter also referred to as a precision slot) is an element that requires high precision in machining. Note that in the description of the second embodiment, the points that differ from the first embodiment are described, and the constituent elements already described are given the same reference numerals and a description thereof is omitted. Unless otherwise described, the constituent elements to which the same reference numerals are applied perform substantially the same operations and functions, and the operations and effects thereof are substantially the same.

First, when the user uploads shape data D1 of an article including a slot 73 from the client terminal 40, the server control unit 22 stores the shape data D1 in the server memory 23. Then, the server control unit 22 causes the display device 46 to display a setting screen. The user inputs and sets various kinds of information such as slot information on the setting screen. One example of the setting screen is illustrated in FIGS. 8A, B, and C.

For example, on the setting screen displayed on the display device 46 of the client terminal 40 illustrated in FIG. 8A, the server control unit 22 acquires from the shape data D1 a length in the longitudinal direction set in the slot 73 (that is, a distance between centers of 14 mm of an arc on both ends) and displays the same. Furthermore, the server control unit 22 acquires from the shape data D1 a width of 7 mm in the lateral direction and displays the same. When the user selects the slot 73, which is subject to setting, the server control unit 22 displays a slot information instruction screen 83 as a pop up. Note that other information that identifies the dimension of the slot may be set to the slot 73. As one example, the other information includes information indicating the outer dimensions of the slot or the radius of the arc at both ends of the slot.

Then, the user selects and inputs the slot information on the slot information instruction screen 83. Specifically, the user selects "fit tolerance", which is the tolerance when other members such as the positioning pin 61 and the slot are fitted together, as the tolerance type of the slot width. Moreover, the user selects "H7", which is the tolerance zone class, as the tolerance of the slot 73. Furthermore, the user selects "Ra 1.6", which is the arithmetic average roughness, as the surface roughness of an inner plane of the slot 73. Furthermore, an update button and a cancel button are displayed below a selection section for various kinds of information. When the user selects the update button, the server control unit 22 sets the selected various kinds of information to the shape data D1. Meanwhile, when the user selects the cancel button, the server control unit 22 closes the slot information instruction screen 83.

When a user selects and inputs slot information, a server control unit 22 changes the shape data D1 so as to include various kinds of information and stores it in the server memory 23. Then, the data acquisition unit 24 acquires the shape data D1, wherein the various kinds of information are set, from the server memory 23. Here, the first tolerance information is generally set in the precision slot 73 where the second tolerance information indicates high precision. Thus, assistance processing is performed to aid in the setting of the first tolerance information. Therefore, the server memory 23 stores tolerance data D2 wherein first tolerance information relating to the position of a slot and second tolerance information relating to the dimensions of the slot are associated with each other. Furthermore, the determination unit 25 determines whether the tolerance zone set for the precision slot 73 of the shape data D1 satisfies a predetermined condition. In the example in FIG. 8A, "H7", which is a high precision tolerance zone class, is set for the precision slot 73. Therefore, the determination unit 25 determines that the tolerance zone of the precision slot 73 satisfies a predetermined condition and that setting of the first tolerance information is necessary.

When it is determined that the tolerance zone satisfies a predetermined condition, the assistance unit 26 performs assistance processing for assisting in the setting of the first tolerance information on the basis of the tolerance data D2. In the example in FIG. 8B, the assistance unit 26 notifies the user of first tolerance information that is capable of being set for the precision slot 73 as assistance processing. That is, the assistance unit 26 causes the server control unit 22 to display on the setting screen a value candidate of a tolerance value and a position candidate that is a candidate of a setting subject of a reference as first tolerance information that is capable of being set. For example, the assistance unit 26 acquires, from the tolerance data D2, first tolerance information associated with the tolerance zone class "H7", which is the second tolerance information. Then, the assistance unit 26 causes the server control unit 22 to display on the display device 46 the obtained first tolerance information as a position candidate and value candidate.

Here, the reference in the first tolerance information is at least one of the design origin O, which is an origin set in the shape data D1, and a precision hole 74, which is another element different to the precision slot 73 that is an element. In the example in FIG. 8B, in the tolerance data D2, two distances from the design origin O as a reference, two distances from one of the precision holes 74 as a reference, and the value of the tolerance of each distance are associated with the second tolerance information as the first tolerance information corresponding to the second tolerance information "H7". Thus, the assistance unit 26 causes the server control unit 22 to display two candidates indicated by a two-dot chain line as position candidates for which the design origin O is a reference.

Furthermore, the assistance unit 26 causes the server control unit 22 to display two candidates indicated by a one-dot chain line as position candidates for which one of the precision holes 74, which is another element, is a reference. Moreover, the assistance unit 26 causes the server control unit 22 to display plus/minus "0.02" as respective value candidates.

Then, the user selects a desired candidate from the position candidates and the value candidates. The server control unit 22 sets the selected candidate to the shape data D1 and causes the display device 46 to display the set first tolerance information. FIG. 8C illustrates an example where the user selects a position candidate for which the design origin O is a reference and selects a value candidate of plus/minus "0.02". Next, the user inputs and sets the first tolerance information for the precision hole 74 as described in the first embodiment.

Furthermore, in FIGS. 8A, B, and C, "4×φ6" is displayed for holes 75 other than a precision slot and a precision hole as information indicating that a hole having a hole diameter of 6 mm is machined in each of four locations. Furthermore, FIGS. 8A, B, and C displays information indicating that the X direction dimension of the article A is 150 mm and the Y direction dimension of the article A is 75 mm.

According to the second embodiment described above, candidates of tolerance information that is capable of being set may be notified to the user. Therefore, it is possible to reduce the time for input processing by the user and to shorten the processing time required for design processing accompanying the quotation of an article. Moreover, since the candidates for tolerance information that is capable of being set are automatically notified to the user, the occurrence of errors accompanying the setting of tolerance information may be suppressed.

[Variations]

As one example of a variation, the assistance unit 26 may automatically set first tolerance information that is capable of being set for an element to the shape data D1. In this case, when it is determined that the tolerance zone satisfies a predetermined condition, the assistance unit 26 selects, as assistance processing based on the tolerance data D2, any of first tolerance information that is capable of being set for the precision slot 73. Then, the assistance unit 26 sets the first tolerance information selected as illustrated in FIG. 8C to the shape data D1 without causing the server control unit 22 to display the candidate illustrated in FIG. 8B. Moreover, the assistance unit 26 causes the server control unit 22 to display the set first tolerance information on the display device 46. Thus, the tolerance information that is capable of being set by the user may be automatically set. Therefore, it is possible to reduce the time for input processing by the user and to shorten the processing time required for design processing accompanying the quotation of an article. Moreover, since the tolerance information that is capable of being set is automatically set, the occurrence of errors accompanying the setting of tolerance information may be suppressed.

As another example of a variation, the assistance unit 26 may notify the user of both the first tolerance information and the second tolerance information that are capable of being set for an element or automatically set the same to the shape data D1. For example, the user prepares in advance tolerance data D2 wherein the material and first tolerance information and second tolerance information corresponding to the length and width of the slot are associated with each other. The assistance unit 26 performs assistance processing when shape data D1 wherein a slot including the material set to the tolerance data D2 and the length and width is uploaded. In this case, the assistance unit 26 identifies first tolerance information and second tolerance information predetermined for the slot as assistance processing based on the tolerance data D2. Then, the assistance unit 26 causes the server control unit 22 to display on the display device 46 the identified first tolerance information and second tolerance information as candidates, similar to the aspect illustrated in FIG. 8B. Thereafter, the user selects a desired candidate from the position candidates and the value candidates. The server control unit 22 sets the selected candidate to the shape data D1 and causes the display device 46 to display the set first tolerance information and second tolerance information.

Alternatively, the assistance unit 26 may automatically set the identified first tolerance information and second tolerance information as illustrated in FIG. 8C to the shape data D1 without causing the server control unit 22 to display the candidate illustrated in FIG. 8B. In this case, the assistance unit 26 causes the server control unit 22 to display the set first tolerance information on the display device 46. When there is no desired first tolerance information and second tolerance information, the user may change the displayed first tolerance information and second tolerance information. Thus, it is possible to notify the user of tolerance information that is capable of being set or to automatically set the same by the user simply uploading the shape data D1. Therefore, it is possible to reduce the time for input processing by the user and to shorten the processing time required for design processing accompanying the quotation of an article. Moreover, since the tolerance information that is capable of being set is notified to the user or automatically set, the occurrence of errors accompanying the setting of tolerance information may be suppressed.

A further other example of a variation will be described with reference to FIGS. 9A, B, and C. In the example of FIG. 9A, B, C, the user inputs the first tolerance information to the slot 73. First, the server control unit 22 causes the display device 46 of the client terminal 40 to display a setting screen. Then, the user inputs and sets the first tolerance information on the setting screen.

For example, the server control unit 22 acquires the length and width set in the slot 73 from the shape data D1 and causes the setting screen displayed by the display device 46 of the client terminal 40 to display the same, as illustrated in FIG. 9A. When the user selects the slot 73, which is subject to setting, the server control unit 22 displays the first tolerance information instruction screen 82 as a pop up. Then, the user selects and inputs the first tolerance information on the first tolerance information instruction screen 82. Specifically, the user inputs a range of plus 0.02 mm to minus 0.02 mm. That is, the user inputs a range of plus 0.02 mm to minus 0.02 mm as the first tolerance information of the slot 73 for which the design origin O is a reference.

When the user selects and inputs the first tolerance information, the server control unit 22 changes the shape data D1 so as to include the first tolerance information and stores it in the server memory 23. Moreover, as illustrated in FIG. 9B, the server control unit 22 causes the display device 46 to display the input first tolerance information. Then, the data acquisition unit 24 acquires the shape data D1, wherein the first tolerance information is set, from the server memory 23. Here, the second tolerance information is generally set to the slot wherein the first tolerance information is set. Thus, assistance processing is performed to aid in the setting of the second tolerance information. Therefore, the determination unit 25 determines whether the tolerance zone satisfies a predetermined condition.

Specifically, when the first tolerance information is set, the determination unit 25 determines that the tolerance zone satisfies a predetermined condition. Alternatively, the determination unit 25 may determine whether a tolerance value smaller than the predetermined value is set. In the example in FIG. 9B, the first tolerance information is set for the slot 73. Therefore, the determination unit 25 determines that the tolerance zone of the slot 73 satisfies a predetermined condition and that setting of the second tolerance information is necessary.

When it is determined that the tolerance zone satisfies a predetermined condition, the assistance unit 26 performs assistance processing for assisting in the setting of the second tolerance information on the basis of the tolerance data D2. Therefore, the server control unit 22 displays the slot information instruction screen 83 as a pop up. Then, as illustrated in FIG. 9B, the assistance unit 26 notifies the user of second tolerance information "H7" that is capable of being set for the slot 73 as assistance processing. In the displayed slot information instruction screen 83, the user selects slot information and second tolerance information in the same manner as the content described above. Then, when the user selects the update button, the server control unit 22 changes the shape data D1 so as to include various kinds of information and stores it in the server memory 23. The server control unit 22 causes the display device 46 to display the selected slot information and second tolerance information. FIG. 9C illustrates an example wherein the user selects the second tolerance information "H7". Moreover, when there is no desired second tolerance information, the user may change the displayed value candidate and input the tolerance value.

Alternatively, the assistance unit 26 may automatically set second tolerance information that is capable of being set for the element to the shape data D1. In this case, when it is determined that the tolerance zone satisfies a predetermined condition, the assistance unit 26 selects, as assistance processing based on the tolerance data D2, any of second tolerance information that is capable of being set for the slot 73. Then, the assistance unit 26 sets the second tolerance information selected as illustrated in FIG. 9C to the shape data D1 without causing the server control unit 22 to display the candidate illustrated in FIG. 9B. Moreover, the assistance unit 26 causes the server control unit 22 to display the set second tolerance information on the display device 46. When there is no desired second tolerance information, the user may change the displayed second tolerance information.

Thus, the tolerance information that is capable of being set by the user may be notified to the user or automatically set. Therefore, it is possible to reduce the time for input processing by the user and to shorten the processing time required for design processing accompanying the quotation of an article. Moreover, since the tolerance information that is capable of being set is notified to the user or automatically set, the occurrence of errors accompanying the setting of tolerance information may be suppressed. Note that in FIGS. 9A, B, and C, only the first tolerance information in the X direction is set for the slot 73, but the user may also select and input the first tolerance information in the Y direction.

Third Embodiment

Figure 10:
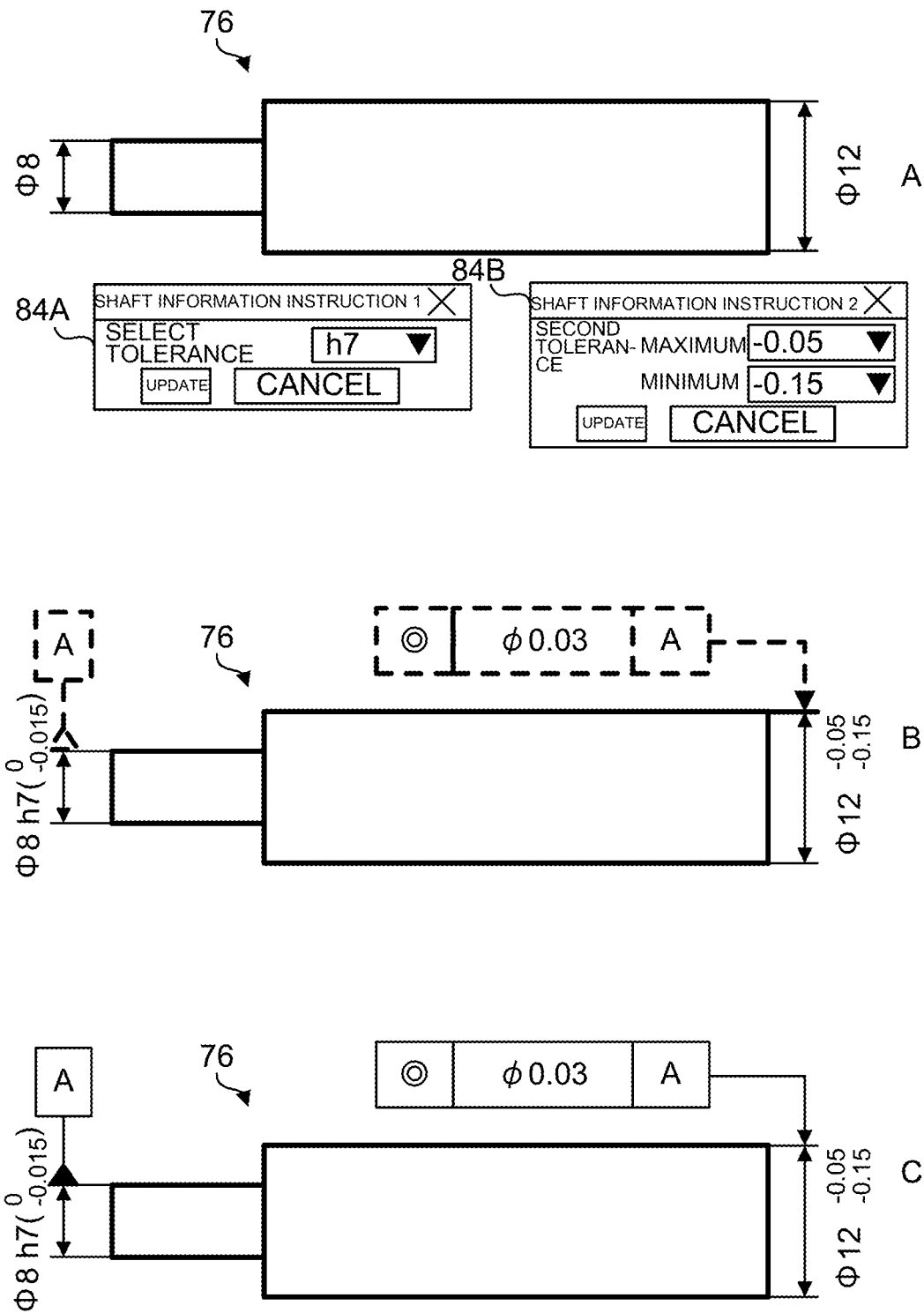
FIG. 10 is a diagram illustrating one example of the setting screen according to a third embodiment.
Figure 11:
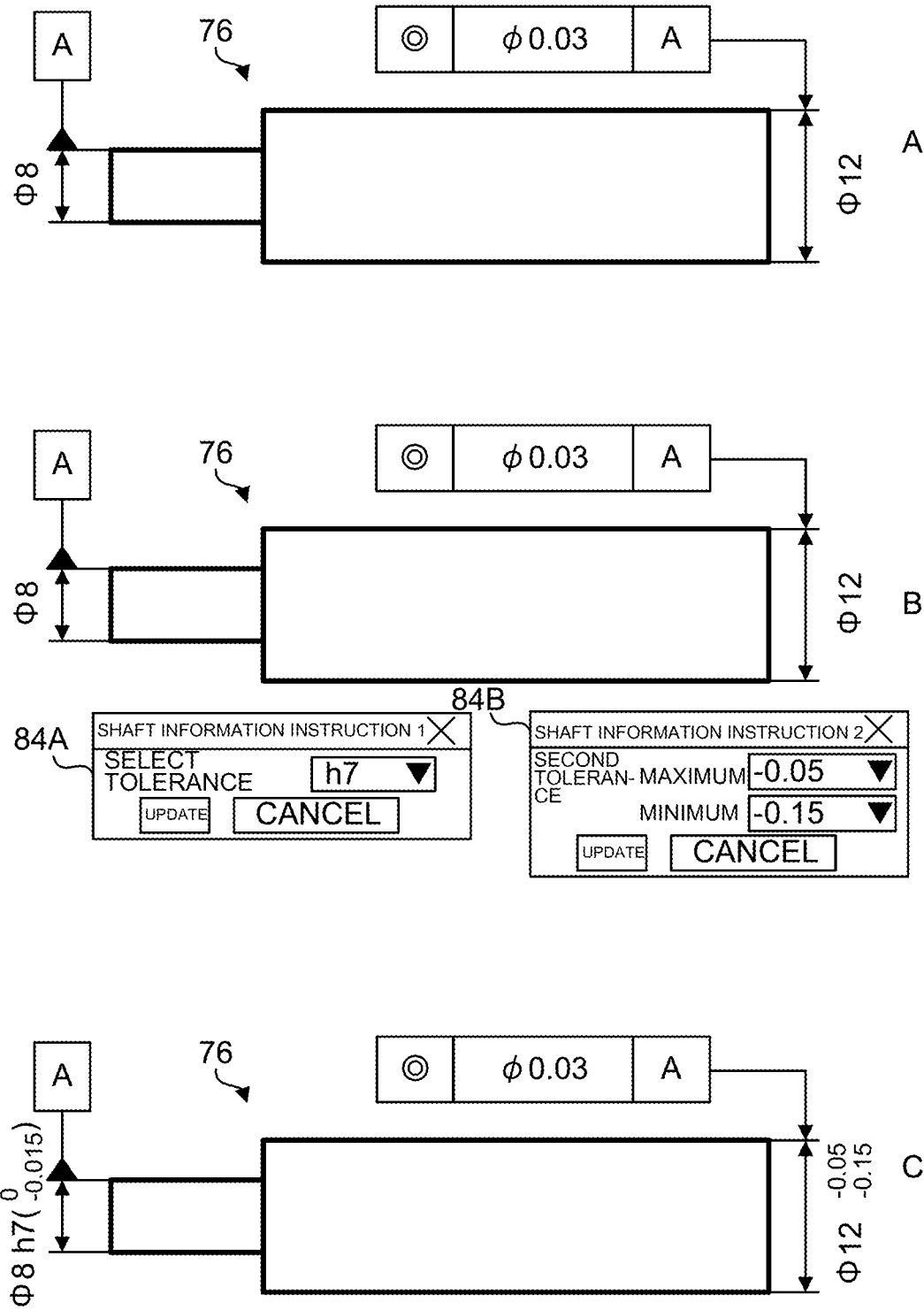
FIG. 11 is a diagram illustrating another example of the setting screen according to the third embodiment.

A third embodiment will be described with reference to FIG. 10 and FIG. 11. The third embodiment differs from the first and second embodiments in that a shaft is included as an element of an article. The shaft is an element requiring high precision in machining. Note that in the description of the third embodiment, the points that differ from the first and second embodiment are described, and the constituent elements already described are given the same reference numerals and a description thereof is omitted. Unless otherwise described, the constituent elements to which the same reference numerals are applied perform substantially the same operations and functions, and the operations and effects thereof are substantially the same.

When the user uploads shape data D1 of an article including a shaft 76 from the client terminal 40, the server control unit 22 stores the shape data D1 in the server memory 23. Then, the server control unit 22 causes the display device 46 to display a setting screen. The user inputs and sets various kinds of information such as shaft information on the setting screen. One example of the setting screen is illustrated in FIGS. 10A, B, and C.

For example, the server control unit 22 acquires a shaft diameter of 8 mm of a small diameter portion and a shaft diameter of 12 mm of a large diameter portion set in the shaft 76 from the shape data D1 and causes the setting screen illustrated in FIG. 10A to display the same. Note that other information that identifies the dimension of the shaft may be set to the shaft 76. The other information includes, as one example, information indicating the length of the small diameter portion and the length of the large diameter portion. When the user selects the shaft 76, which is subject to setting, the server control unit 22 displays a shaft information instruction screen 84A for the small diameter portion and a shaft information instruction screen 84B for the large diameter portion as a pop up.

Then, the user selects and inputs the shaft information on the shaft information instruction screens 84A and 84B. Specifically, the user selects "h7", which is the tolerance zone class of the shaft, as the second tolerance information for the small diameter portion of the shaft 76. Furthermore, the user selects a range of minus 0.05 mm to minus 0.15 mm as the second tolerance information of the large diameter portion of the shaft 76. Furthermore, an update button and a cancel button are displayed below a selection section for various kinds of information. When the user selects the update button, the server control unit 22 sets the selected various kinds of information to the shape data D1. Meanwhile, when the user selects the cancel button, the server control unit 22 closes the shaft information instruction screens 84A and 84B.

When a user selects and inputs shaft information, a server control unit 22 changes the shape data D1 so as to include various kinds of information and stores it in the server memory 23. Then, the data acquisition unit 24 acquires the shape data D1, wherein the various kinds of information are set, from the server memory 23. Here, the first tolerance information is generally set in the shaft 76 where the second tolerance information indicates high precision. Thus, assistance processing is performed to aid in the setting of the first tolerance information. Therefore, the server memory 23 stores tolerance data D2 wherein first tolerance information relating to the position of a shaft and second tolerance information with respect to the first tolerance information are associated with each other.

As one example, a geometric reference may be the central axis of the small diameter portion or the large diameter portion, or the circle center of the small diameter portion or the large diameter portion. When the geometric reference is the central axis, the first tolerance information includes a tolerance, for example, coaxiality, of a distance from the axis line of the central axis serving as a reference to the central axis of the element. Moreover, when the geometric reference is a circle center, the first tolerance information includes a tolerance, for example, concentricity, of a distance from the central axis serving as a reference to the central axis of an element within a circle having the central axis at the circle center as the center point. In the following example, a description will be given of when the geometric reference is the central axis of the small diameter portion.

The determination unit 25 determines whether the tolerance zone set for the shaft 76 of the shape data D1 satisfies a predetermined condition. In the example in FIG. 10A, "h7", which is a high precision tolerance zone class, is set for the small diameter portion of the shaft 76. Furthermore, a range of minus 0.05 mm to minus 0.15 mm, which is a high precision tolerance zone, is also set for the large diameter portion of the shaft 76. Therefore, the determination unit 25 determines that the tolerance zone of the shaft 76 satisfies a predetermined condition and that setting of the first tolerance information is necessary. Note that the determination unit 25 may determine that the tolerance zone satisfies a predetermined condition when at least one of the tolerance zone class and the tolerance of the shaft diameter is set for the shaft 76.

When it is determined that the tolerance zone satisfies a predetermined condition, the assistance unit 26 performs assistance processing for assisting in the setting of the first tolerance information on the basis of the tolerance data D2. In the example in FIG. 10B, the assistance unit 26 notifies the user of first tolerance information that is capable of being set for the shaft 76 as assistance processing. That is, the assistance unit 26 causes the server control unit 22 to display on the setting screen a value candidate of a value for coaxiality and a position candidate for the geometric reference (hereinafter also referred to as datum) as first tolerance information that is capable of being set. For example, the assistance unit 26 acquires first tolerance information associated with a tolerance zone class "h7" that is second tolerance information from the tolerance data D2, and causes the server control unit 22 to display the acquired first tolerance information on the display device 46 as a position candidate and value candidate.

Here, the datum is at least one of the central axis of the small diameter portion and the central axis of the large diameter portion. In the example in FIG. 10B, in the tolerance data D2, the central axis of the small diameter portion which is the datum and the value of the coaxiality are associated with the second tolerance information as first tolerance information corresponding to the second tolerance information "h7". Thus, the assistance unit 26 causes the server control unit 22 to display a symbol, that indicates the datum, with respect to the central axis of the small diameter portion to indicate the position candidate. Moreover, the assistance unit 26 causes the server control unit 22 to display "φ0.03" as the value candidates of coaxiality.

Then, the user selects a desired candidate from the position candidates and the value candidates. The server control unit 22 sets the selected candidate to the shape data D1 and causes the display device 46 to display the set first tolerance information. FIG. 10C illustrates an example where the user selects the central axis of the small diameter portion, which is a position candidate, as datum and selects a coaxiality of "φ0.03", which is a value candidate. Note that the user may select the central axis of the large diameter portion as the datum or select another value as the coaxiality.

According to the third embodiment described above, candidates of tolerance information that is capable of being set may be notified to the user. Therefore, it is possible to reduce the time for input processing by the user and to shorten the processing time required for design processing accompanying the quotation of an article. Moreover, since the candidates for tolerance information that is capable of being set are automatically notified to the user, the occurrence of errors accompanying the setting of tolerance information may be suppressed.

[Variations]

As one example of a variation, the assistance unit 26 may automatically set first tolerance information that is capable of being set for an element to the shape data D1. In this case, when it is determined that the tolerance zone satisfies a predetermined condition, the assistance unit 26 selects, as assistance processing based on the tolerance data D2, any of first tolerance information that is capable of being set for the shaft 76. Then, the assistance unit 26 sets the first tolerance information selected as illustrated in FIG. 10C to the shape data D1 without causing the server control unit 22 to display the candidate illustrated in FIG. 10B. Moreover, the assistance unit 26 causes the server control unit 22 to display the set first tolerance information on the display device 46. Thus, the tolerance information that is capable of being set by the user may be automatically set. Therefore, it is possible to reduce the time for input processing by the user and to shorten the processing time required for design processing accompanying the quotation of an article. Moreover, since the tolerance information that is capable of being set is automatically set, the occurrence of errors accompanying the setting of tolerance information may be suppressed.

As another example of a variation, the assistance unit 26 may notify the user of both the first tolerance information and the second tolerance information that are capable of being set for an element or automatically set the same to the shape data D1. For example, the user prepares in advance tolerance data D2 wherein the material and first tolerance information and second tolerance information corresponding to the shaft diameter are associated with each other. An assistance unit 26 performs assistance processing when shape data D1 wherein a material and a shaft diameter are set to the tolerance data D2 is uploaded. In this case, the assistance unit 26 identifies first tolerance information and second tolerance information predetermined for the shaft as assistance processing based on the tolerance data D2. Then, the assistance unit 26 causes the server control unit 22 to display on the display device 46 the identified first tolerance information and second tolerance information as candidates, similar to the aspect illustrated in FIG. 10B. Thereafter, the user selects a desired candidate from the position candidates and the value candidates. The server control unit 22 sets the selected candidate to the shape data D1 and causes the display device 46 to display the set first tolerance information and second tolerance information.

Alternatively, the assistance unit 26 may automatically set the identified first tolerance information and second tolerance information as illustrated in FIG. 10C to the shape data D1 without causing the server control unit 22 to display the candidate illustrated in FIG. 10B. In this case, the assistance unit 26 causes the server control unit 22 to display the set first tolerance information on the display device 46. When there is no desired first tolerance information and second tolerance information, the user may change the displayed first tolerance information and second tolerance information. Thus, it is possible to notify the user of tolerance information that is capable of being set or to automatically set the same by the user simply uploading the shape data D1. Therefore, it is possible to reduce the time for input processing by the user and to shorten the processing time required for design processing accompanying the quotation of an article. Moreover, since the tolerance information that is capable of being set is notified to the user or automatically set, the occurrence of errors accompanying the setting of tolerance information may be suppressed.

A further other example of a variation will be described with reference to FIGS. 11A, B, and C. In the example of FIG. 11A, B, C, the user inputs the first tolerance information to the shaft 76. First, the server control unit 22 causes the display device 46 of the client terminal 40 to display a setting screen. Then, the user inputs and sets the first tolerance information on an information instruction screen of the setting screen.

For example, when the user selects the shaft 76, which is subject to setting, the server control unit 22 displays an information instruction screen (not illustrated) as a pop up. Then, the user selects and inputs the first tolerance information on the information instruction screen. Specifically, on the setting screen illustrated in FIG. 11A, the user selects the central axis of the small diameter portion as the datum and selects and inputs "φ0.03" as the value of coaxiality. When the user selects and inputs the first tolerance information, the server control unit 22 changes the shape data D1 so as to include the first tolerance information and stores it in the server memory 23. Then, the server control unit 22 displays a symbol, that indicates the datum, with respect to the central axis of the small diameter portion on the basis of the first tolerance information acquired from the shape data D1. Furthermore, the server control unit 22 is caused to display "φ0.03" as the value of coaxiality.

Then, the data acquisition unit 24 acquires the shape data D1, wherein the first tolerance information is set, from the server memory 23. Here, the second tolerance information is generally set to the shaft wherein the first tolerance information is set. Thus, assistance processing is performed to aid in the setting of the second tolerance information. Therefore, the determination unit 25 determines whether the tolerance zone satisfies a predetermined condition.

Specifically, when the first tolerance information, for example, coaxiality, is set, the determination unit 25 determines that the tolerance zone satisfies a predetermined condition. Alternatively, the determination unit 25 may determine whether a coaxiality smaller than the predetermined value is set. In the example in FIG. 11B, the coaxiality is set for the shaft 76. Therefore, the determination unit 25 determines that the tolerance zone of the shaft 76 satisfies a predetermined condition and that setting of the second tolerance information is necessary.

When it is determined that the tolerance zone satisfies a predetermined condition, the assistance unit 26 performs assistance processing for assisting in the setting of the second tolerance information on the basis of the tolerance data D2. Therefore, the server control unit 22 displays the shaft information instruction screens 84A and 84B as a pop up. Then, as illustrated in FIG. 11B, the assistance unit 26 notifies the user of tolerance zone class "h7" as second tolerance information that is capable of being set for the shaft 76, as well as the values of tolerance being "−0.05" and "−0.15", as assistance processing. In the displayed shaft information instruction screens 84A and 84B, the user selects shaft information in the same manner as the content described above. Then, when the user selects the update button, the server control unit 22 changes the shape data D1 so as to include various kinds of information and stores it in the server memory 23. The server control unit 22 causes the display device 46 to display the selected shaft information. FIG. 11C illustrates an example wherein the user selects "h7", "−0.05", and "−0.15" as the second tolerance information. Moreover, when there is no desired second tolerance information, the user may change and input the displayed second tolerance information.

Alternatively, the assistance unit 26 may automatically set second tolerance information that is capable of being set for the element to the shape data D1. In this case, when it is determined that the tolerance zone satisfies a predetermined condition, the assistance unit 26 selects, as assistance processing based on the tolerance data D2, any of second tolerance information that is capable of being set for the shaft 76. Then, the assistance unit 26 sets the second tolerance information selected as illustrated in FIG. 11C to the shape data D1 without causing the server control unit 22 to display the candidate illustrated in FIG. 11B. Moreover, the assistance unit 26 causes the server control unit 22 to display the set second tolerance information on the display device 46. When there is no desired second tolerance information, the user may change the displayed second tolerance information.

Thus, the tolerance information that is capable of being set by the user may be notified to the user or automatically set. Therefore, it is possible to reduce the time for input processing by the user and to shorten the processing time required for design processing accompanying the quotation of an article. Moreover, since the tolerance information that is capable of being set is notified to the user or automatically set, the occurrence of errors accompanying the setting of tolerance information may be suppressed.

The present invention was described above with reference to each embodiment, but the present invention is not limited to the embodiments described above. Inventions that have been changed to an extent that does not violate the present invention and inventions equivalent to the present invention are also included in the present invention. Furthermore, each embodiment and each variation may be appropriately combined to an extent that does not conflict with the present invention.

For example, a system provided with the server 20 may be used for applications other than quotation. As one example, a system provided with a server 20 may be used for designing an article. Even in this case, the processing time required for design processing may be shortened, and the occurrence of errors accompanying the setting of tolerance information during design may be suppressed.

Furthermore, the quotation system 100 may include a client terminal 40. In this case, at least one portion of each means provided in the server control unit 22 may be provided in the terminal control unit 45 of the client terminal 40. As one example, at least one of the data acquisition unit 24, the determination unit 25, or the assistance unit 26 may be provided in the terminal control unit 45. For example, the client terminal 40 receives the shape data D1 input by the user and stores it in a terminal memory 44. Then, the data acquisition unit 24 of the terminal control unit 45 acquires the shape data D1 from the terminal memory 44. Moreover, the assistance unit 26 of the terminal control unit 45 performs assistance processing for assisting in the setting of at least one of the first tolerance information and the second tolerance information on the basis of the tolerance data D2 stored by the terminal memory 44.

Furthermore, the user may change the shape or dimensions of the article A on a web page provided by the server control unit 22. In this case, the server control unit 22 reflects the changes made by the user in the shape data D1 and stores it in the server memory 23. Then, the data acquisition unit 24 acquires the shape data D1, wherein the changes are reflected, from the server memory 23.

REFERENCE SIGNS LIST

22: Server control unit (computer)
23: Server memory (storage means)
24: Data acquisition unit (data acquisition means)
25: Determination unit (determination means)
26: Assistance unit (assistance means)
27: Quotation unit (quotation means)
28: Ordering unit (ordering means)
40: Client terminal
46: Display device
71: Precision hole (element)
73: Precision slot (element)
76: Axis (element)
100: Quotation system
D1: Shape data
D2: Tolerance data
O: Design origin (origin)
PG: Quotation program

The invention claimed is:

1. A quotation system that receives shape data of an article configured from a plurality of elements from a client terminal and provides quotation information of the article, the quotation system comprising:
a memory storing the shape data and tolerance data in which multiple types of tolerance information relating to the elements are associated with each other; and
a computer,
wherein the computer is configured to:
determine, when one type of tolerance information in the multiple types of tolerance information is set for the element, whether a tolerance zone of the one type of tolerance information satisfies a predetermined condition,
perform assistance processing to assist in setting of another type of tolerance information, in which at least a part of information differs from the one type of tolerance information, in the multiple types of tolerance information when it is determined that the tolerance zone satisfies the predetermined condition.

2. The quotation system according to claim 1, wherein the computer determines that the predetermined condition is satisfied when the tolerance zone of the one type of tolerance information has higher precision than a predetermined tolerance zone class.

3. The quotation system according to claim 1, wherein the computer notifies a user of the other type of tolerance information that is capable of being set for the elements or sets the other type of tolerance information to the shape data, when it is determined that the predetermined condition is satisfied.

4. The quotation system according to claim 1, wherein the multiple types of tolerance information include a tolerance of a distance of the elements from at least one of an origin set to the shape data and another element different from the elements.

5. The quotation system according to claim 1, wherein the multiple types of tolerance information include a tolerance of a distance from a geometric reference to a central axis of the elements.

6. The quotation system according to claim 1, wherein the multiple types of tolerance information include a tolerance zone class relating to the elements.

7. A quotation method in a quotation system that receives shape data of an article configured from a plurality of elements from a client terminal and provides quotation information of the article, and is provided with a computer, the quotation method comprising the steps of:
- storing the shape data and tolerance data in which multiple types of tolerance information relating to the elements are associated with each other;
- determining, when one type of tolerance information in the multiple types of tolerance information is set for the element, whether a tolerance zone of the one type of tolerance information satisfies a predetermined condition; and
- performing assistance processing to assist in setting of another type of tolerance information, in which at least a part of information differs from the one type of tolerance information, in the multiple types of tolerance information when it is determined that the tolerance zone satisfies the predetermined condition.

8. A computer-readable non-transitory storage medium storing a quotation program of a quotation system that receives shape data of an article configured from a plurality of elements from a client terminal and provides quotation information of the article, and is provided with a memory storing the shape data and tolerance data in which multiple types of tolerance information relating to the elements are associated with each other, and a computer, wherein the quotation program causes the computer to:
- determine, when one type of tolerance information in the multiple types of tolerance information is set for the element, whether a tolerance zone of the one type of tolerance information satisfies a predetermined condition, and
- perform assistance processing to assist in setting of another type of tolerance information, in which at least a part of information differs from the one type of tolerance information, in the multiple types of tolerance information when it is determined that the tolerance zone satisfies the predetermined condition.

* * * * *